US011915655B2

(12) United States Patent
Lu et al.

(10) Patent No.: US 11,915,655 B2
(45) Date of Patent: Feb. 27, 2024

(54) SHIFT REGISTER UNIT, METHOD FOR DRIVING SHIFT REGISTER UNIT, GATE DRIVING CIRCUIT, AND DISPLAY DEVICE

(71) Applicant: BOE Technology Group Co., Ltd., Beijing (CN)

(72) Inventors: Jiangnan Lu, Beijing (CN); Guangliang Shang, Beijing (CN); Xinshe Yin, Beijing (CN); Libin Liu, Beijing (CN); Ke Feng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 137 days.

(21) Appl. No.: 17/631,780

(22) PCT Filed: Mar. 5, 2021

(86) PCT No.: PCT/CN2021/079324
§ 371 (c)(1),
(2) Date: Jan. 31, 2022

(87) PCT Pub. No.: WO2022/183489
PCT Pub. Date: Sep. 9, 2022

(65) Prior Publication Data
US 2023/0162685 A1    May 25, 2023

(51) Int. Cl.
*G09G 3/3266* (2016.01)
*G11C 19/28* (2006.01)

(52) U.S. Cl.
CPC .......... *G09G 3/3266* (2013.01); *G11C 19/28* (2013.01); *G09G 2300/0408* (2013.01); *G09G 2310/0286* (2013.01)

(58) Field of Classification Search
CPC .......... G09G 3/20; G09G 3/32; G09G 3/3266; G09G 2300/0408; G09G 2310/0286; G11C 19/28
See application file for complete search history.

(56) References Cited

U.S. PATENT DOCUMENTS

2010/0134399 A1    6/2010  Ki et al.
2015/0015562 A1*   1/2015  Han ..................... G09G 3/3266
                                                345/212

(Continued)

FOREIGN PATENT DOCUMENTS

CN    102651186 A    8/2012
CN    105632560 A    6/2016
(Continued)

*Primary Examiner* — Stacy Khoo
(74) *Attorney, Agent, or Firm* — Banner & Witcoff, Ltd.

(57) ABSTRACT

A shift register unit, a method for driving a shift register unit, a gate driving circuit, and a display device are provided. The shift register unit includes: an input control circuit, configured to control a level of the first node; a first control circuit, configured to control a level of the second node; a second control circuit, configured to control the level of the second node under control of a fourth clock signal and an output signal; an output circuit, configured to control a level of the output terminal under control of the level of the first node and the level of the second node; and a first reset circuit, configured to control the level of the output terminal under control of the first enable signal, so as to allow the output terminal to stably output a non-operating level during a detection phase.

20 Claims, 6 Drawing Sheets

(56) References Cited

U.S. PATENT DOCUMENTS

2017/0193961 A1    7/2017  Wang
2020/0150473 A1    5/2020  Umezaki et al.
2020/0243150 A1*  7/2020  Chen .................... G09G 3/3266

FOREIGN PATENT DOCUMENTS

| CN | 105741742 A | 7/2016 |
|---|---|---|
| CN | 106920526 A | 7/2017 |
| CN | 109979374 A | 7/2019 |
| CN | 110033734 A | 7/2019 |
| CN | 111754950 A | 10/2020 |
| KR | 20190069179 A | 6/2019 |

\* cited by examiner

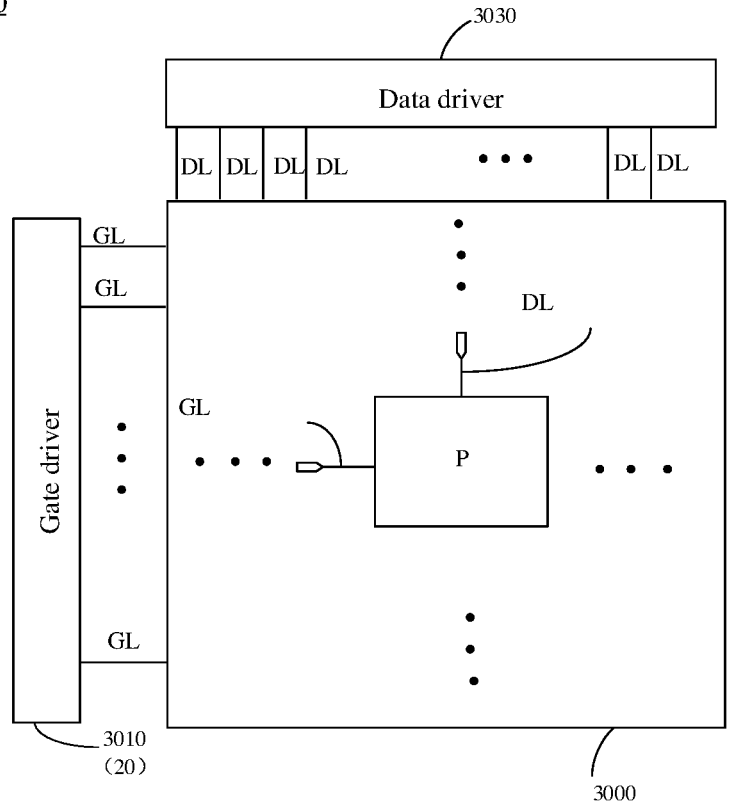

S1001: in a driving phase, under control of the input signal, the first clock signal, the second clock signal, the third clock signal, the fourth clock signal, and the enable signal, controlling the level of the output terminal to output a driving signal in the driving phase S1002: in the detection phase, the input control circuit controlling the level of the first node to be the non-operating level under control of the input signal, the first clock signal, the second clock signal, and the third clock signal; the first control circuit controlling the level of the second node under control of the level of the first node; the second control circuit controlling the level of the second node under control of the fourth clock signal and the output signal; the output circuit controlling the level of the output terminal under control of the level of the first node and the level of the second node; and the first reset circuit controlling the level of the output terminal under control of the first enable signal, so as to allow the output terminal to stably output the non-operating level during the detection phase

FIG. 10

SHIFT REGISTER UNIT, METHOD FOR DRIVING SHIFT REGISTER UNIT, GATE DRIVING CIRCUIT, AND DISPLAY DEVICE

The application is a U.S. National Phase Entry of International Application No. PCT/CN2021/079324 filed on Mar. 5, 2021, designating the United States of America. The present application claims priority to and the benefit of the above-identified application and the above-identified application is incorporated by reference herein in its entirety.

TECHNICAL FIELD

Embodiments of the present disclosure relate to a shift register unit, a method for driving a shift register unit, a gate driving circuit, and a display device.

BACKGROUND

In the field of display technology, for example, a pixel array of an OLED or a liquid crystal display usually include a plurality of rows of gate lines and a plurality of columns of data lines interlaced therewith. The gate lines can be driven by an attached integrated drive circuit. In recent years, with the continuous improvement of amorphous silicon thin film technology, the gate line driver circuit can also be directly integrated on a thin film transistor array substrate to form a gate driver on array (GOA) to drive the gate lines.

For example, a GOA including a plurality of cascaded shift register units can be used to provide switching-state voltage signals for the plurality of rows of gate lines of the pixel array, thereby controlling the plurality of rows of gate lines to be turned on sequentially, and the data lines provide the data signals to pixel units in the corresponding row in the pixel array to form the gray level voltages required for respective gray levels of the displayed image, and then each frame of image is displayed.

SUMMARY

At least one embodiment of the present disclosure provides a shift register unit, which comprises: an input control circuit, a first control circuit, a second control circuit, an output circuit, and a first reset circuit. The input control circuit is coupled to a first node, an input terminal, a first clock signal terminal, a second clock signal terminal, and a third clock signal terminal, and is configured to control a level of the first node under control of an input signal of the input terminal, a first clock signal of the first clock signal terminal, a second clock signal of the second clock signal terminal, and a third clock signal of the third clock signal terminal; the first control circuit is coupled to the first node and a second node, and is configured to control a level of the second node under control of the level of the first node; the second control circuit is coupled to a fourth clock signal terminal, the second node, and an output terminal, and is configured to control the level of the second node under control of a fourth clock signal of the fourth clock signal terminal and an output signal of the output terminal; the output circuit is coupled to the first node, the second node, and the output terminal, and is configured to control a level of the output terminal under control of the level of the first node and the level of the second node; and the first reset circuit is coupled to the output terminal and a first enable signal terminal, a first enable signal is provided to the first enable signal terminal by a first enable signal line, and the first reset circuit is configured to control the level of the output terminal under control of the first enable signal, so as to allow the output terminal to stably output a non-operating level during a detection phase.

For example, the shift register unit provided by at least one embodiment of the present disclosure further comprises a second reset circuit. The second reset circuit is coupled to the second node and a second enable signal terminal, a second enable signal is provided to the second enable signal terminal by a second enable signal line, and the second reset circuit is configured to control the level of the second node under control of the second enable signal.

For example, in the shift register unit provided by at least one embodiment of the present disclosure, the first enable signal and the second enable signal are a same enable signal.

For example, in the shift register unit provided by at least one embodiment of the present disclosure, the first reset circuit comprises a first transistor, a gate electrode of the first transistor is coupled to the first enable signal terminal to receive the first enable signal, a first electrode of the first transistor is coupled to a first voltage terminal to receive a first voltage, and a second electrode of the first transistor is coupled to the output terminal.

For example, in the shift register unit provided by at least one embodiment of the present disclosure, the second reset circuit comprises a second transistor, a gate electrode of the second transistor is coupled to the second enable signal terminal to receive the second enable signal, a first electrode of the second transistor is coupled to the second node, and a second electrode of the second transistor is coupled to a second voltage terminal to receive a second voltage.

For example, in the shift register unit provided by at least one embodiment of the present disclosure, the input control circuit comprises an input circuit, the input circuit is coupled to the first clock signal terminal, the input terminal, a third node, and a fourth node, and is configured to control a level of the third node and a level of the fourth node in response to the input signal of the input terminal and the first clock signal of the first clock signal terminal.

For example, in the shift register unit provided by at least one embodiment of the present disclosure, the input control circuit comprises a third control circuit, the third control circuit is coupled to the second clock signal terminal, the first node, and the third node, and is configured to provide the second clock signal of the second clock signal terminal to the first node under control of the level of the third node.

For example, in the shift register unit provided by at least one embodiment of the present disclosure, the input control circuit comprises a third reset circuit, the third reset circuit is coupled to the third clock signal terminal, the first node, and the third node, and is configured to control the level of the third node and the level of the first node in response to the third clock signal of the third clock signal terminal.

For example, in the shift register unit provided by at least one embodiment of the present disclosure, the first control circuit comprises a third transistor, a gate electrode of the third transistor is coupled to the first node, a first electrode of the third transistor is coupled to a third voltage terminal to receive a third voltage, and a second electrode of the third transistor is coupled to the second node.

For example, in the shift register unit provided by at least one embodiment of the present disclosure, the second control circuit comprises a sixth transistor, a seventh transistor, and a first capacitor, a gate electrode of the sixth transistor is coupled to the fourth clock signal terminal to receive the fourth clock signal, a first electrode of the sixth transistor is coupled to the second node, and a second electrode of the sixth transistor is coupled to a fifth voltage terminal to receive a fifth voltage; a gate electrode of the seventh transistor is coupled to the output terminal, a first electrode of the seventh transistor is coupled to a sixth voltage terminal to receive a sixth voltage, and a second electrode of the seventh transistor is coupled to the second node; and a first electrode of the first capacitor is coupled to the output terminal, and a second electrode of the first capacitor is coupled to the second node.

For example, in the shift register unit provided by at least one embodiment of the present disclosure, the output circuit comprises a fourth transistor, a fifth transistor, an eighth transistor, and a ninth transistor, a gate electrode of the fourth transistor is coupled to the first node, a first electrode of the fourth transistor is coupled to a fourth voltage terminal to receive a fourth voltage, and a second electrode of the fourth transistor is coupled to a first electrode of the fifth transistor; a gate electrode of the fifth transistor is coupled to the first node, and a second electrode of the fifth transistor is coupled to the output terminal; a gate electrode of the eighth transistor is coupled to the second node, a first electrode of the eighth transistor is coupled to the output terminal, and a second electrode of the eighth transistor is coupled to a seventh voltage terminal to receive a seventh voltage; and a gate electrode of the ninth transistor is coupled to the output terminal, a first electrode of the ninth transistor is coupled to the first electrode of the fifth transistor, and a second electrode of the ninth transistor is coupled to an eighth voltage terminal to receive an eighth voltage.

For example, in the shift register unit provided by at least one embodiment of the present disclosure, the input circuit comprises a tenth transistor, an eleventh transistor, a twelfth transistor, a thirteenth transistor, and a fourteenth transistor, a gate electrode of the tenth transistor is coupled to the input terminal to receive the input signal, a first electrode of the tenth transistor is coupled to a second electrode of the eleventh transistor, and a second electrode of the tenth transistor is coupled to a ninth voltage terminal to receive a ninth voltage; a gate electrode of the eleventh transistor is coupled to the first clock signal terminal to receive the first clock signal, and a first electrode of the eleventh transistor is coupled to the third node; a gate electrode of the twelfth transistor is coupled to the input terminal to receive the input signal, a first electrode of the twelfth transistor is coupled to a tenth voltage terminal to receive a tenth voltage, and a second electrode of the twelfth transistor is coupled to the fourth node; a gate electrode of the thirteenth transistor is coupled to a first electrode of the fourteenth transistor, a first electrode of the thirteenth transistor is coupled to an eleventh voltage terminal to receive an eleventh voltage, and a second electrode of the thirteenth transistor is coupled to the fourth node; and a gate electrode of the fourteenth transistor is coupled to a twelfth voltage terminal to receive a twelfth voltage, and a second electrode of the fourteenth transistor is coupled to the third node.

For example, in the shift register unit provided by at least one embodiment of the present disclosure, the third control circuit comprises a fifteenth transistor, a second capacitor, and a third capacitor. A gate electrode of the fifteenth transistor is coupled to the third node, a first electrode of the fifteenth transistor is coupled to the first node, and a second electrode of the fifteenth transistor is coupled to the second clock signal terminal to receive the second clock signal; a first electrode of the second capacitor is coupled to the first node, and a second electrode of the second capacitor is coupled to the third node; and a first electrode of the third capacitor is coupled to the third node, and a second electrode of the third capacitor is coupled to a thirteenth voltage terminal to receive a thirteenth voltage.

For example, in the shift register unit provided by at least one embodiment of the present disclosure, the third reset circuit comprises a sixteenth transistor, a seventeenth transistor, an eighteenth transistor, a nineteenth transistor, and a fourth capacitor. A gate electrode of the sixteenth transistor is coupled to the third clock signal terminal to receive the third clock signal, a first electrode of the sixteenth transistor is coupled to a fourteenth voltage terminal to receive a fourteenth voltage, and a second electrode of the sixteenth transistor is coupled to a gate electrode of the seventeenth transistor; a first electrode of the seventeenth transistor is coupled to a fifteenth voltage terminal to receive a fifteenth voltage, and a second electrode of the seventeenth transistor is coupled to a first electrode of the nineteenth transistor; a gate electrode of the eighteenth transistor is coupled to the fourth node, a first electrode of the eighteenth transistor is coupled to a sixteenth voltage terminal to receive a sixteenth voltage, and a second electrode of the eighteenth transistor is coupled to the first node; a gate electrode of the nineteenth transistor is coupled to a seventeenth voltage terminal to receive a seventeenth voltage, and a second electrode of the nineteenth transistor is coupled to the third node; and a first electrode of the fourth capacitor is coupled to the gate electrode of the seventeenth transistor, and a second electrode of the fourth capacitor is coupled to the first electrode of the seventeenth transistor.

For example, in the shift register unit provided by at least one embodiment of the present disclosure, the nineteenth transistor and the fourteenth transistor are a same transistor.

At least one embodiment of the present disclosure provides a shift register unit, which comprises: a first transistor to an eighteenth transistor, and a first capacitor to a fourth capacitor. A gate electrode of the first transistor is coupled to a first enable signal terminal to receive a first enable signal, a first electrode of the first transistor is coupled to a first voltage terminal to receive a first voltage, and a second electrode of the first transistor is coupled to an output terminal; a gate electrode of a second transistor is coupled to a second enable signal terminal to receive a second enable signal, a first electrode of the second transistor is coupled to a second node, and a second electrode of the second transistor is coupled to a second voltage terminal to receive a second voltage; a gate electrode of a third transistor is coupled to the first node, a first electrode of the third transistor is coupled to a third voltage terminal to receive a third voltage, and a second electrode of the third transistor is coupled to the second node; a gate electrode of a fourth transistor is coupled to the first node, a first electrode of the fourth transistor is coupled to a fourth voltage terminal to receive a fourth voltage, and a second electrode of the fourth transistor is coupled to a first electrode of a fifth transistor; a gate electrode of the fifth transistor is coupled to the first node, and a second electrode of the fifth transistor is coupled to the output terminal; a gate electrode of a sixth transistor is coupled to a fourth clock signal terminal to receive a fourth clock signal, a first electrode of the sixth transistor is coupled to the second node, and a second electrode of the sixth transistor is coupled to a fifth voltage terminal to receive a fifth voltage; a gate electrode of a seventh transistor is coupled to the output terminal, a first electrode of the seventh transistor is coupled to a sixth voltage terminal to receive a sixth voltage, and a second electrode of the seventh transistor is coupled to the second node; a gate electrode of an eighth transistor is coupled to the second node, a first electrode of the eighth transistor is coupled to the output terminal, and a second electrode of the eighth transistor is coupled to a seventh voltage terminal to receive a seventh voltage; a gate electrode of a ninth transistor is coupled to the output terminal, a first electrode of the ninth transistor is coupled to the first electrode of the fifth transistor, and a second electrode of the ninth transistor is coupled to an eighth voltage terminal to receive an eighth voltage; a first electrode of the first capacitor is coupled to the output terminal, and a second electrode of the first capacitor is coupled to the second node; a gate electrode of a tenth transistor is coupled to an input terminal to receive an input signal, a first electrode of the tenth transistor is coupled to a second electrode of an eleventh transistor, and a second electrode of the tenth transistor is coupled to a ninth voltage terminal to receive a ninth voltage; a gate electrode of the eleventh transistor is coupled to a first clock signal terminal to receive a first clock signal, and a first electrode of the eleventh transistor is coupled to a third node; a gate electrode of a twelfth transistor is coupled to the input terminal to receive the input signal, a first electrode of the twelfth transistor is coupled to a tenth voltage terminal to receive a tenth voltage, and a second electrode of the twelfth transistor is coupled to a fourth node; a gate electrode of a thirteenth transistor is coupled to a first electrode of a fourteenth transistor, a first electrode of the thirteenth transistor is coupled to an eleventh voltage terminal to receive an eleventh voltage, and a second electrode of the thirteenth transistor is coupled to the fourth node; a gate electrode of the fourteenth transistor is coupled to a twelfth voltage terminal to receive a twelfth voltage, and a second electrode of the fourteenth transistor is coupled to the third node; a gate electrode of a fifteenth transistor is coupled to the third node, a first electrode of the fifteenth transistor is coupled to the first node, and a second electrode of the fifteenth transistor is coupled to a second clock signal terminal to receive a second clock signal; a first electrode of a second capacitor is coupled to the first node, and a second electrode of the second capacitor is coupled to the third node; a first electrode of a third capacitor is coupled to the third node, and a second electrode of the third capacitor is coupled to a thirteenth voltage terminal to receive a thirteenth voltage; a gate electrode of a sixteenth transistor is coupled to a third clock signal terminal to receive a third clock signal, a first electrode of the sixteenth transistor is coupled to a fourteenth voltage terminal to receive a fourteenth voltage, and a second electrode of the sixteenth transistor is coupled to a gate electrode of a seventeenth transistor; a first electrode of the seventeenth transistor is coupled to a fifteenth voltage terminal to receive a fifteenth voltage, and a second electrode of the seventeenth transistor is coupled to the gate electrode of the thirteenth transistor; a gate electrode of the eighteenth transistor is coupled to the fourth node, a first electrode of the eighteenth transistor is coupled to a sixteenth voltage terminal to receive a sixteenth voltage, and a second electrode of the eighteenth transistor is coupled to the first node; and a first electrode of the fourth capacitor is coupled to the gate electrode of the seventeenth transistor, and a second electrode of the fourth capacitor is coupled to the first electrode of the seventeenth transistor.

At least one embodiment of the present disclosure provides a gate driving circuit, which comprises a plurality of shift register units, which are cascaded, according to any one of embodiments of the present disclosure.

For example, in the gate driving circuit provided by at least one embodiment of the present disclosure, an input terminal of a shift register unit of an N-th stage is coupled to a first node of a shift register unit of a (N−1)-th stage; and N is an integer greater than 2.

At least one embodiment of the present disclosure provides a display device, which comprises the shift register unit according to any one of embodiments of the present disclosure or the gate driving circuit according to any one of embodiments of the present disclosure.

At least one embodiment of the present disclosure provides a method for driving the shift register unit according to any one of embodiments of the present disclosure. The method comprises: in a driving phase, under control of the input signal, the first clock signal, the second clock signal, the third clock signal, the fourth clock signal, and the enable signal, controlling the level of the output terminal to output a driving signal in the driving phase; and in a detection phase, the input control circuit controlling the level of the first node to be the non-operating level under control of the input signal, the first clock signal, the second clock signal, and the third clock signal; the first control circuit controlling the level of the second node under control of the level of the first node; the second control circuit controlling the level of the second node under control of the fourth clock signal and the output signal; the output circuit controlling the level of the output terminal under control of the level of the first node and the level of the second node; and the first reset circuit controlling the level of the output terminal under control of the first enable signal, so as to allow the output terminal to stably output the non-operating level during the detection phase.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

FIG. 9 is a schematic block diagram of a display device provided by at least one embodiment of the present disclosure; and FIG. 10 is a flowchart of a method for driving a shift register unit provided by at least one embodiment of the present disclosure.

DETAILED DESCRIPTION

Figure 1:
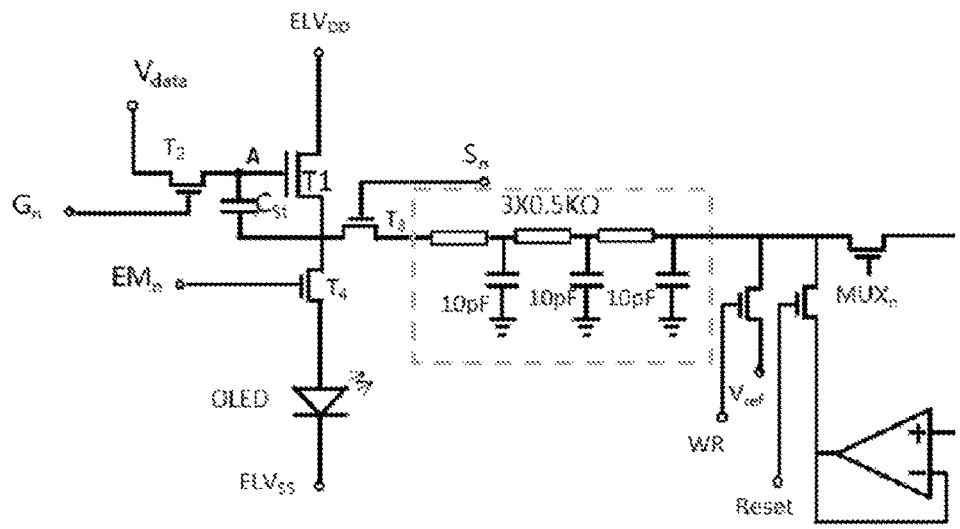
FIG. 1 is a schematic diagram of an external compensation current detection system provided by at least one embodiment of the present disclosure.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to reduce the power consumption of the display panel, a relatively effective method is to reduce the refresh frequency. While reducing the refresh frequency, it is also necessary to ensure the display quality of the display panel. Therefore, the GOA circuit is required to maintain a stable output with low noise at a relatively low refresh frequency. In addition, an organic light emitting diode (OLED) display device usually includes a plurality of pixel units arranged in an array, and each pixel unit may include, for example, a pixel circuit. In the OLED display device, due to the limitation of the manufacturing process, threshold voltages of driving transistors in respective pixel circuits may be different, and due to, for example, the influence of temperature change, the threshold voltage of the driving transistor may drift. Therefore, the difference in the threshold voltages of respective driving transistors may cause poor display (such as uneven display), and therefore, the threshold voltage needs to be compensated. In addition, when the driving transistor is in an off state (that is, cut-off state), the existence of leakage current may also cause poor display. Therefore, the OLED display device usually adopts a pixel circuit with a compensation function, for example, adding transistors and/or capacitors to the basic pixel circuit (for example, 2T1C, that is, two transistors and one capacitor), so as to provide the compensation function. For example, the compensation function can be achieved by voltage compensation, current compensation, or hybrid compensation. The pixel circuit with the compensation function is, for example, a common 4T1C or 4T2C circuit.

Generally, in an external compensation current detection system, as shown in FIG. 1, a current detection phase and a driving phase are separated. For example, in the current detection phase, the EM signal in FIG. 1 needs to be maintained at a low level all the time, so that the transistor T4 is turned off, so that the OLED does not emit light, and in the driving phase, the EM signal needs to work normally. Therefore, the EM signal needs to meet the two functions of maintaining at a non-operating level (such as a low level) for a long time and a normal driving operation. However, the signal provided by the conventional GOA circuit cannot achieve the function of maintaining at a non-operating level (such as a low level) for a long time.

Therefore, at least one embodiment of the present disclosure provides a shift register unit, and the shift register unit comprises: an input control circuit, a first control circuit, a second control circuit, an output circuit, and a first reset circuit. The input control circuit is coupled to a first node, an input terminal, a first clock signal terminal, a second clock signal terminal, and a third clock signal terminal, and is configured to control a level of the first node under control of an input signal of the input terminal, a first clock signal of the first clock signal terminal, a second clock signal of the second clock signal terminal, and a third clock signal of the third clock signal terminal. The first control circuit is coupled to the first node and a second node, and is configured to control a level of the second node under control of the level of the first node. The second control circuit is coupled to a fourth clock signal terminal, the second node, and an output terminal, and is configured to control the level of the second node under control of a fourth clock signal of the fourth clock signal terminal and an output signal of the output terminal. The output circuit is coupled to the first node, the second node, and the output terminal, and is configured to control a level of the output terminal under control of the level of the first node and the level of the second node. The first reset circuit is coupled to the output terminal and a first enable signal terminal, a first enable signal is provided to the first enable signal terminal by a first enable signal line, and the first reset circuit is configured to control the level of the output terminal under control of the first enable signal, so as to allow the output terminal to stably output a non-operating level during a detection phase.

Correspondingly, at least one embodiment of the present disclosure also provides a method for driving the shift register unit described above, a gate driving circuit, and a display device.

The shift register unit provided by the embodiment of the present disclosure can ensure that the output noise interference is removed in time under low frequency driving (for example, 1~120 Hz), so as to ensure that the GOA stably outputs a non-operating level (for example, a low level) during the detection phase. The shift register unit can not only achieve long-term low-level stable output during the detection phase to meet the requirements of the external compensation detection phase, but also provide driving signals that operate normally during the driving phase to meet the requirements of the display panel in the driving phase.

The embodiments and examples of the present disclosure will be described in detail below with reference to the accompanying drawings. It should be noted that the same reference numeral in different drawings will be used to refer to the same element that has been described.

It should be noted that, in the embodiments of the present disclosure, for example, in the case where each circuit is implemented as the N-type transistor, the term "pull-up" means charging a node or an electrode of a transistor so as to raise the absolute value of the level of the node or the electrode, thereby implementing an operation (e.g., conduction) of the corresponding transistor; the term "pull-down" means discharging a node or an electrode of a transistor so as to decrease the absolute value of the level of the node or the electrode, thereby implementing an operation (e.g., turn-off) of the corresponding transistor; the term "operating level" means that the node is at a high level, so that when a gate electrode of a transistor is coupled to the node, the transistor is turned on; the term "non-operating level" means that the node is at a low level, so that when a gate electrode of a transistor is coupled to the node, the transistor is turned off. For another example, in the case where each circuit is implemented as the P-type transistor, the term "pull-up" means discharging a node or an electrode of a transistor so as to decrease the absolute value of the level of the node or the electrode, thereby implementing the operation (e.g., conduction) of the corresponding transistor; the term "pull-down" means charging a node or an electrode of a transistor so as to raise the absolute value of the level of the node or the electrode, thereby implementing the operation (e.g., turn-off) of the corresponding transistor; the term "operating level" means that the node is at a low level, so that when a gate electrode of a transistor is coupled to the node, the transistor is turned on; the term "non-operating level" means that the node is at a high level, so that when a gate electrode of a transistor is coupled to the node, the transistor is turned off.

Figure 2:
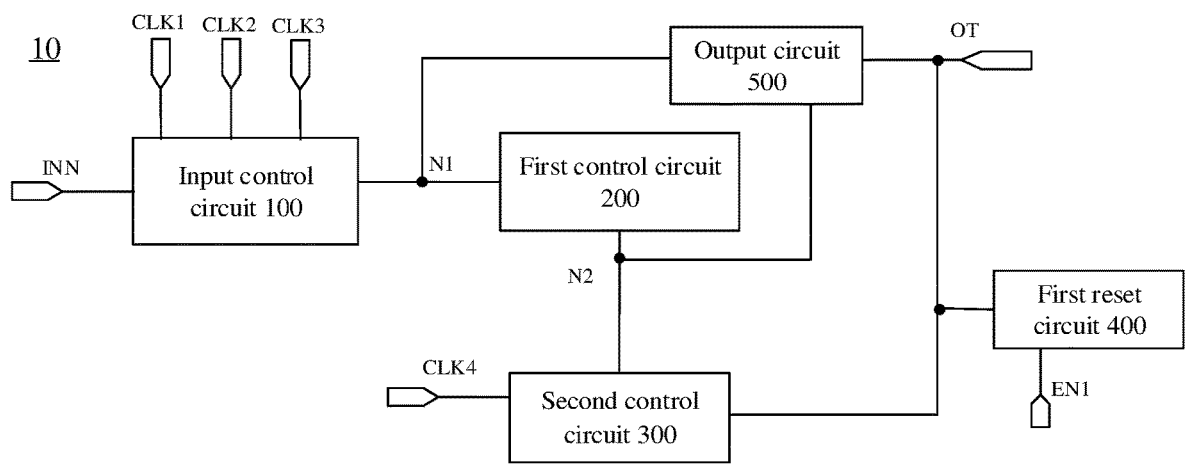
FIG. 2 is a schematic block diagram of a shift register unit provided by at least one embodiment of the present disclosure.

At least one embodiment of the present disclosure provides a shift register unit 10, as shown in FIG. 2. FIG. 2 is a schematic diagram of a shift register unit 10 according to at least one embodiment of the present disclosure. The shift register unit 10 includes: an input control circuit 100, a first control circuit 200, a second control circuit 300, a first reset circuit 400, and an output circuit 500.

For example, as shown in FIG. 2, in an example, the input control circuit 100 is coupled to a first node N1, an input terminal INN, a first clock signal terminal CLK1, a second clock signal terminal CLK2, and a third clock signal terminal CLK3, and is configured to control a level of the first node N1 under control of an input signal of the input terminal INN, a first clock signal of the first clock signal terminal CLK1, a second clock signal of the second clock signal terminal CLK2, and a third clock signal of the third clock signal terminal CLK3.

For example, the first control circuit 200 is coupled to the first node N1 and a second node N2, and is configured to control a level of the second node N2 under control of the level of the first node N1.

For example, the second control circuit 300 is coupled to a fourth clock signal terminal CLK4, the second node N2, and an output terminal OT, and is configured to control the level of the second node N2 under control of a fourth clock signal of the fourth clock signal terminal CLK4 and an output signal of the output terminal OT.

For example, the output circuit 500 is coupled to the first node N1, the second node N2, and the output terminal OT, and is configured to control a level of the output terminal OT under control of the level of the first node N1 and the level of the second node N2.

For example, the first reset circuit 400 is coupled to the output terminal OT and a first enable signal terminal EN1, a first enable signal is provided to the first enable signal terminal EN1 by a first enable signal line, and the first reset circuit 400 is configured to control the level of the output terminal OT under control of the first enable signal EN1, so as to allow the output terminal OT to stably output a non-operating level during a detection phase.

For example, in at least one embodiment of the present disclosure, by providing the first reset circuit 400, it can be ensured that the output noise interference is removed in time under low frequency driving, so as to ensure that the shift register unit 10 stably outputs a non-operating level (such as, a low level) during the detection phase. For example, by introducing the first enable signal EN1, when the first enable signal EN1 is at an active level, the output terminal OT of the shift register unit 10 can output the non-operating level stably for a long time during the detection phase to meet the requirements of the external compensation detection phase, when the first enable signal EN1 is at an invalid level, the output terminal OT of the shift register unit 10 can output a driving signal that operates normally in the driving phase, so as to meet the requirements of the display panel in the driving phase.

It should be noted that, for the convenience and conciseness of description, in each embodiment of the present disclosure, CLK1 may represent either the first clock signal terminal or the first clock signal provided by the first clock signal terminal; similarly, CLK2 can represent either the second clock signal terminal or the second clock signal provided by the second clock signal terminal; CLK3 can represent either the third clock signal terminal or the third clock signal provided by the third clock signal terminal; CLK4 can represent either the fourth clock signal terminal or the fourth clock signal provided by the fourth clock signal terminal; EN1 can represent either the first enable signal terminal or the first enable signal provided by the first enable signal terminal; INN can represent either the input terminal or the input signal provided by the input terminal, and OT can represent either the output terminal or the output signal provided by the output terminal.

It should also be noted that in the description of the various embodiments of the present disclosure, the first node N1, the second node N2, the third node N3 appearing in the following, the fourth node N4 appearing in the following, and the fifth node N5 appearing in the following do not represent actual components, but represent the junction points of related electrical couplings in the circuit diagram.

Figure 3:
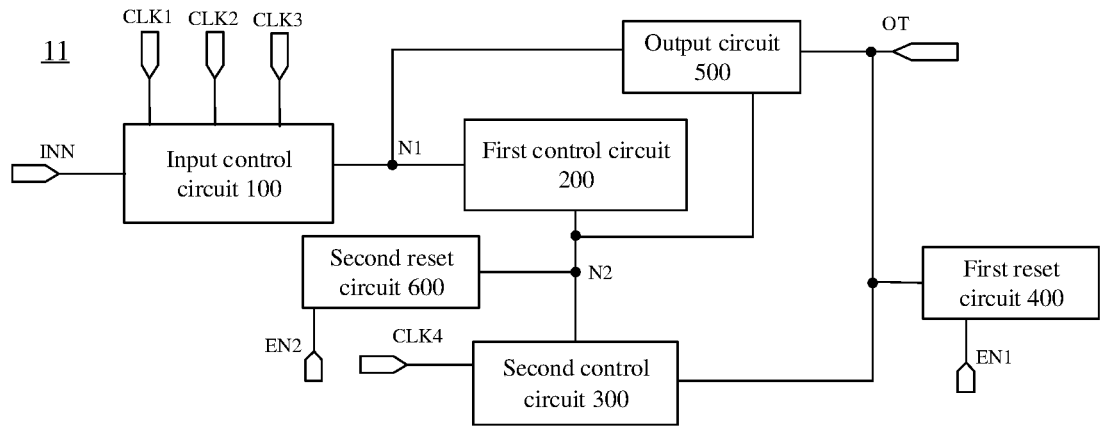
FIG. 3 is a schematic block diagram of another shift register unit provided by at least one embodiment of the present disclosure.

FIG. 3 is a schematic block diagram of another shift register unit provided by at least one embodiment of the present disclosure. For example, as shown in FIG. 3, in addition to the input control circuit 100, the first control circuit 200, the second control circuit 300, the first reset circuit 400, and the output circuit 500 described above, the shift register unit 11 may also include a second reset circuit 600.

As shown in FIG. 3, for example, the second reset circuit 600 is coupled to the second node N2 and a second enable signal terminal EN2, a second enable signal is provided to the second enable signal terminal EN2 by a second enable signal line. The second reset circuit 600 is configured to control the level of the second node N2 under the control of the second enable signal EN2.

For example, in at least one embodiment of the present disclosure, the shift register unit 11 is provided with a first reset circuit 400 and a second reset circuit 600, and under the control of the first enable signal EN1 and the second enable signal EN2, the level of the output terminal OT and the level of the second node N2 can be controlled at the same time, so as to better ensure that the output noise interference is removed in time under low frequency driving, so as to ensure that the shift register unit 11 stably outputs a non-operating level (such as, a low level) during the detection phase.

For example, in an example, the first enable signal of the first enable signal terminal EN1 and the second enable signal of the second enable signal terminal EN2 may be the same enable signal EN, and correspondingly, the first enable signal terminal EN1 and the second enable signal terminal EN2 may be the same signal terminal. Of course, the first enable signal of the first enable signal terminal EN1 and the second enable signal of the second enable signal terminal EN2 can also be different enable signals independent of each other. Accordingly, the first enable signal terminal EN1 and the second enable signal terminal EN2 may be different signal terminals, and the embodiments of the present disclosure are not specifically limited in this aspect.

It should be noted that, for the convenience and conciseness of description, in each embodiment of the present disclosure, EN2 can represent either the second enable signal terminal or the second enable signal provided by the second enable signal terminal; EN can represent either the enable signal terminal or the enable signal provided by the enable signal terminal.

Figure 4:
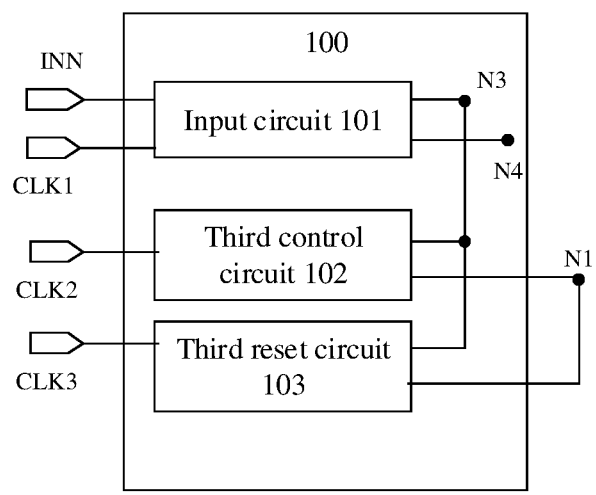
FIG. 4 is a schematic diagram of an input control circuit provided by at least one embodiment of the present disclosure.

FIG. 4 is a schematic diagram of an input control circuit provided by at least one embodiment of the present disclosure. For example, in at least one embodiment of the present disclosure, as shown in FIG. 4, the input control circuit 100 may include an input circuit 101, a third control circuit 102, and a third reset circuit 103.

For example, in an example, the input circuit 101 is coupled to the first clock signal terminal CLK1, the input terminal INN, a third node N3, and a fourth node N4, and is configured to control the level of the third node N3 and the level of the fourth node N4 in response to the input signal of the input terminal INN and the first clock signal of the first clock signal terminal CLK1.

For example, in an example, the third control circuit 102 is coupled to the second clock signal terminal CLK2, the first node N1, and the third node N3, and is configured to provide the second clock signal of the second clock signal terminal CLK2 to the first node N1 under control of a level of the third node N3.

For example, in an example, the third reset circuit 103 is coupled to the third clock signal terminal CLK3, the first node N1, and the third node N3, and is configured to control the level of the third node N3 and the level of the first node N1 in response to the third clock signal of the third clock signal terminal CLK3.

Figure 5A:
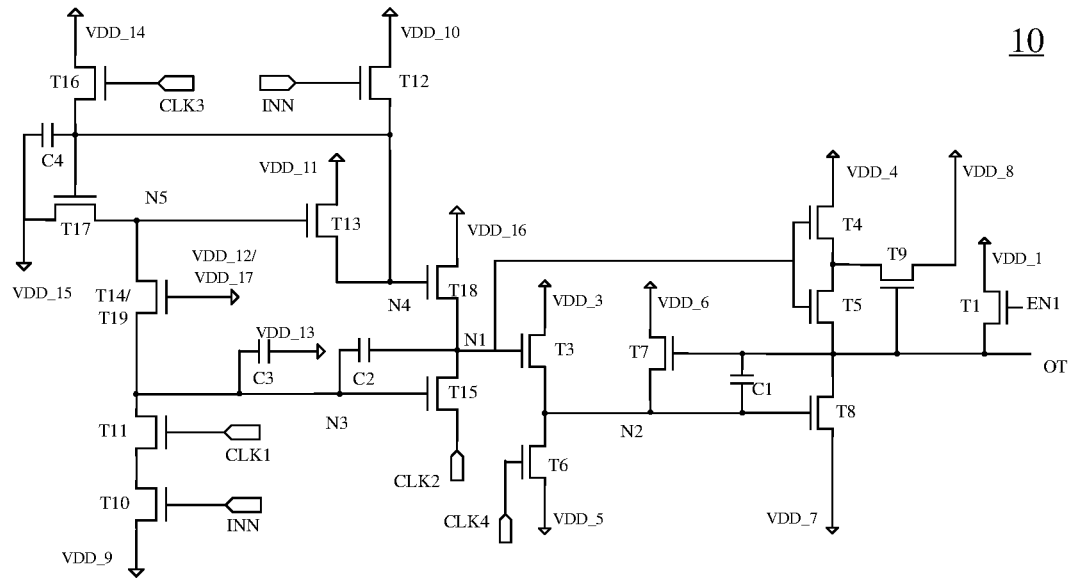
FIG. 5A is a circuit structure diagram of a shift register unit provided by at least one embodiment of the present disclosure.

The circuit structure of the shift register unit 10 provided by at least one embodiment of the present disclosure will be described in detail below with reference to FIG. 5A. FIG. 5A is a circuit structure diagram of a shift register unit 10 provided by at least one embodiment of the present disclosure. It should be noted that although the embodiments of the present disclosure are described below by taking each transistor as an N-type transistor as an example, this does not constitute a limitation to the embodiments of the present disclosure.

For example, in at least one embodiment of the present disclosure, as shown in FIG. 5A, the first reset circuit 400 may include a first transistor T1. For example, a gate electrode of the first transistor T1 is coupled to the first enable signal terminal EN1 to receive the first enable signal, a first electrode of the first transistor T1 is coupled to a first voltage terminal VDD_1 to receive a first voltage, and a second electrode of the first transistor T1 is coupled to the output terminal OT.

For example, in an example, when the first enable signal EN1 is active, the first transistor T1 is turned on, and the first voltage terminal VDD_1 is coupled to the output terminal OT. For example, when the first voltage provided by the first voltage terminal VDD_1 is at a non-operating level, that is, a low level, the output terminal OT can be noise-reduced.

It is to be noted that, transistors used in the embodiments of the present disclosure may all be thin film transistors, field effect transistors, or other switching elements with the same characteristics. In the embodiments of the present disclosure, the thin film transistor is taken as an example for description. A source electrode and a drain electrode of the transistor used herein may be symmetrical in structure, so the source electrode and the drain electrode of the transistor may have no difference in structure. In the embodiments of the present disclosure, in order to distinguish two electrodes of the transistor apart from the gate electrode, one of the two electrodes is directly referred to as a first electrode, and the other of the two electrodes is referred to as a second electrode.

In addition, the transistors in the embodiments of the present disclosure are all described by taking N-type transistors as examples, in this case, the first electrode of the transistor is a drain electrode, and the second electrode is a source electrode. It should be noted that the present disclosure includes but is not limited to this. For example, one or more transistors in the shift register unit 10 provided by the embodiments of the present disclosure may also be P-type transistors, in this case, the first electrode of the transistor is a source electrode and the second electrode of the transistor is a drain electrode, so long as the respective electrodes of the selected type transistor are connected correspondingly with reference to the respective electrodes of the corresponding transistor in the embodiments of the present disclosure, and the corresponding voltage terminal is provided with a corresponding high voltage or low voltage. In the case where an N-type transistor is used, indium gallium zinc oxide (IGZO) can be adopted as an active layer of a thin film transistor, and compared to adopting low temperature poly silicon (LTPS) or amorphous silicon (for example, hydrogenation amorphous silicon) as an active layer of a thin film transistor, the size of the transistor can be effectively reduced and the leakage current can be prevented.

For example, in at least one embodiment of the present disclosure, as shown in FIG. 5A, the first control circuit 200 includes a third transistor T3.

For example, a gate electrode of the third transistor T3 is coupled to the first node N1, a first electrode of the third transistor T3 is coupled to a third voltage terminal VDD_3 to receive a third voltage, and a second electrode of the third transistor T3 is coupled to the second node N2.

For example, in an example, when the first node N1 is at an active level (for example, a high level), the third transistor T3 is turned on, and then through the third transistor T3, the third voltage (for example, a low level) provided by the third voltage terminal VDD_3 can be input to the second node N2, so as to pull down the level of the second node N2 to a non-operating level (for example, a low level).

For example, in at least one embodiment of the present disclosure, as shown in FIG. 5A, the second control circuit 300 may include a sixth transistor T6, a seventh transistor T7, and a first capacitor C1.

For example, a gate electrode of the sixth transistor T6 is coupled to a fourth clock signal terminal CLK4 to receive a fourth clock signal, a first electrode of the sixth transistor T6 is coupled to the second node N2, and a second electrode of the sixth transistor T6 is coupled to a fifth voltage terminal VDD_5 to receive a fifth voltage.

For example, a gate electrode of the seventh transistor T7 is coupled to the output terminal OT, a first electrode of the seventh transistor T7 is coupled to a sixth voltage terminal VDD_6 to receive a sixth voltage, and a second electrode of the seventh transistor T7 is coupled to the second node N2.

For example, a first electrode of the first capacitor C1 is coupled to the output terminal OT, and a second electrode of the first capacitor C1 is coupled to the second node N2.

For example, in an example, the fourth clock signal provided by the fourth clock signal terminal CLK4 is at an active level (for example, a high level), and the sixth transistor T6 is turned on, and then through the sixth transistor T6, the fifth voltage (for example, a high level) provided by the fifth voltage terminal VDD_5 can be input to the second node N2, and the level of the second node N2 can be pulled up to the operating level (for example, a high level). For example, when the level of the output terminal OT is at the operating level (for example, a high level), the seventh transistor T7 is turned on, and then through the seventh transistor T7, the sixth voltage (for example, a high level) provided by the sixth voltage terminal VDD_6 can be input to the second node N2, so that the second node N2 is maintained at a high level, and due to the bootstrap effect of the first capacitor C1, the output terminal OT is maintained at a high level. It should be noted that in each embodiment of the present disclosure, the storage capacitor (for example, the first capacitor C1, the second capacitor C2, the third capacitor C3, and the fourth capacitor C4 in FIG. 5A, FIG. 5B, and FIG. 6) may be a capacitive device manufactured through a process, for example, a capacitive device is implemented by manufacturing special capacitor electrodes. Each electrode of the storage capacitor can be implemented by a metal layer, a semiconductor layer (for example, doped polysilicon), etc. The storage capacitor can also be a parasitic capacitor between the transistors, which can be implemented by the transistor itself and other devices and lines.

For example, in at least one embodiment of the present disclosure, as shown in FIG. 5A, the output circuit 500 may include a fourth transistor T4, a fifth transistor T5, an eighth transistor T8, and a ninth transistor T9.

For example, a gate electrode of the fourth transistor T4 is coupled to the first node N1, a first electrode of the fourth transistor T4 is coupled to the fourth voltage terminal VDD_4 to receive the fourth voltage, and a second electrode of the fourth transistor T4 is coupled to a first electrode of the fifth transistor T5.

For example, a gate electrode of the fifth transistor T5 is coupled to the first node N1, and a second electrode of the fifth transistor T5 is coupled to the output terminal OT.

For example, a gate electrode of the eighth transistor T8 is coupled to the second node N2, a first electrode of the eighth transistor T8 is coupled to the output terminal OT, and a second electrode of the eighth transistor T8 is coupled to a seventh voltage terminal VDD_7 to receive a seventh voltage.

For example, a gate electrode of the ninth transistor T9 is coupled to the output terminal OT, a first electrode of the ninth transistor T9 is coupled to the first electrode of the fifth transistor T5, and a second electrode of the ninth transistor T9 is coupled to an eighth voltage terminal VDD_8 to receive an eighth voltage.

For example, in an example, when the first node N1 is at an active level (for example, a high level), the fourth transistor T4 and the fifth transistor T5 are both turned on, through the fourth transistor T4 and the fifth transistor T5, the fourth voltage (for example, a low level) provided by the fourth voltage terminal VDD_4 can be input to the output terminal OT, so as to pull down the level of the output terminal OT to a non-operating level (for example, a low level). For example, when the level of the second node N2 is at the operating level (for example, a high level), the eighth transistor T8 is turned on, and then through the eighth transistor T8, the seventh voltage (for example, a high level) provided by the seventh voltage terminal VDD_7 can be input to the output terminal OT, so as to pull up the level of the output terminal OT to the operating level (for example, a high voltage). For example, when the level of the output terminal OT is at the operating level (for example, a high level), the ninth transistor T9 is turned on, and then through the ninth transistor T9, the eighth voltage (for example, a high level) provided by the eighth voltage terminal VDD_8 can be input to the second electrode of the fourth transistor T4 to prevent the fourth transistor T4 from leaking at this time.

For example, in at least one embodiment of the present disclosure, as shown in FIG. 5A, the input circuit 101 includes a tenth transistor T10, an eleventh transistor T11, a twelfth transistor T12, a thirteenth transistor T13, and a fourteenth transistor T14.

For example, a gate electrode of the tenth transistor T10 is coupled to the input terminal INN to receive the input signal, a first electrode of the tenth transistor T10 is coupled to a second electrode of the eleventh transistor T11, and a second electrode of the tenth transistor T10 is coupled to a ninth voltage terminal VDD_9 to receive a ninth voltage.

For example, a gate electrode of the eleventh transistor T11 is coupled to the first clock signal terminal CLK1 to receive the first clock signal, and a first electrode of the eleventh transistor T11 is coupled to the third node N3.

For example, a gate electrode of the twelfth transistor T12 is coupled to the input terminal INN to receive the input signal, a first electrode of the twelfth transistor T12 is coupled to a tenth voltage terminal VDD_10 to receive a tenth voltage, and a second electrode of the twelfth transistor T12 is coupled to a fourth node N4.

For example, a gate electrode of the thirteenth transistor T13 is coupled to a first electrode of the fourteenth transistor T14, a first electrode of the thirteenth transistor T13 is coupled to an eleventh voltage terminal VDD_11 to receive an eleventh voltage, and a second electrode of the thirteenth transistor T13 is coupled to the fourth node N4.

For example, a gate electrode of the fourteenth transistor T14 is coupled to a twelfth voltage terminal VDD_12 to receive a twelfth voltage, and a second electrode of the fourteenth transistor T14 is coupled to the third node N3.

For example, in an example, when the input signal provided by the input terminal INN is at an active level (for example, a high level) and the first clock signal provided by the first clock signal terminal CLK1 is at an active level (for example, a high level), the tenth transistor T10, the eleventh transistor T11, and the twelfth transistor T12 are all turned on, and then through the tenth transistor T10 and the eleventh transistor T11, the ninth voltage (for example, a high level) provided by the ninth voltage terminal VDD_9 is input to the third node N3, so as to pull up the level of the third node N3 to the operating level (for example, a high level). For example, when the twelfth voltage provided by the twelfth voltage terminal VDD_12 is at an active level (for example, a high level), the fourteenth transistor T14 is turned on, so as to couple the third node to the gate electrode of the thirteenth transistor T13, that is, the fifth node N5, thereby pulling up the level of the fifth node N5 to an operating level (for example, a high level), and therefore, the thirteenth transistor T13 is turned on. Through the twelfth transistor T12 and the thirteenth transistor T13, the tenth voltage (for example, a low level) provided by the tenth voltage terminal VDD_10 and the eleventh voltage (for example, a low level) provided by the eleventh voltage terminal VDD_11 are input to the fourth node N4, respectively, so as to pull down the level of the fourth node N4 to a non-operating level (for example, a low level).

For example, in at least one embodiment of the present disclosure, as shown in FIG. 5A, the third control circuit 102 includes a fifteenth transistor T15, a second capacitor C2, and a third capacitor C3.

For example, a gate electrode of the fifteenth transistor T15 is coupled to the third node N3, a first electrode of the fifteenth transistor T15 is coupled to the first node N1, and a second electrode of the fifteenth transistor T15 is coupled to the second clock signal terminal CLK2 to receive the second clock signal.

For example, a first electrode of the second capacitor C2 is coupled to the first node N1, and a second electrode of the second capacitor C2 is coupled to the third node N3.

For example, a first electrode of the third capacitor C3 is coupled to the third node N3, and a second electrode of the third capacitor C3 is coupled to a thirteenth voltage terminal VDD_13 to receive a thirteenth voltage.

For example, in an example, when the third node N3 is at an active level (for example, a high level), the fifteenth transistor T15 is turned on, and then, the second clock signal provided by the second clock signal terminal CLK2 can be input to the first node N1 through the fifteenth transistor T15. For example, when the second clock signal is at an active level (for example, a high level), the first node N1 is pulled up to an operating level (for example, a high level). For example, when the second clock signal is at an invalid level (for example, a low level), the first node N1 may be pulled down to a non-operating level (for example, a low level).

For example, in at least one embodiment of the present disclosure, as shown in FIG. 5A, the third reset circuit 103 includes a sixteenth transistor T16, a seventeenth transistor T17, an eighteenth transistor T18, a nineteenth transistor T19, and a fourth capacitor C4.

For example, a gate electrode of the sixteenth transistor T16 is coupled to the third clock signal terminal CLK3 to receive the third clock signal, a first electrode of the sixteenth transistor T16 is coupled to a fourteenth voltage terminal VDD_14 to receive a fourteenth voltage, and a second electrode of the sixteenth transistor T16 is coupled to a gate electrode of the seventeenth transistor T17.

For example, a first electrode of the seventeenth transistor T17 is coupled to a fifteenth voltage terminal VDD_15 to receive a fifteenth voltage, and a second electrode of the seventeenth transistor T17 is coupled to a first electrode of the nineteenth transistor T19.

For example, a gate electrode of the eighteenth transistor T18 is coupled to the fourth node N4, a first electrode of the eighteenth transistor T18 is coupled to a sixteenth voltage terminal VDD_16 to receive a sixteenth voltage, and a second electrode of the eighteenth transistor T18 is coupled to the first node N1.

For example, a gate electrode of the nineteenth transistor T19 is coupled to a seventeenth voltage terminal VDD_17 to receive a seventeenth voltage, and a second electrode of the nineteenth transistor T19 is coupled to the third node N3.

For example, a first electrode of the fourth capacitor C4 is coupled to the gate electrode of the seventeenth transistor T17, and a second electrode of the fourth capacitor C4 is coupled to the first electrode of the seventeenth transistor T17.

For example, in an example, when the third clock signal provided by the third clock signal terminal CLK3 is at an active level (for example, a high level), the sixteenth transistor T16 is turned on, the fourteenth voltage (for example, a high level) provided by the fourteenth voltage terminal VDD_14 can be input to the fourth node N4 through the sixteenth transistor T16, so as to pull up the fourth node N4 to the operating level (for example, a high voltage). In response to the fourth node N4 being at the operating level (for example, a high level), the seventeenth transistor T17 and the eighteenth transistor T18 are turned on, and then through the seventeenth transistor T17, the fifteenth voltage (for example, a low level) provided by the fifteenth voltage terminal VDD_15 can be input to the gate electrode of the thirteenth transistor T13, that is, the fifth node N5, so as to pull down the level of the fifth node N5 to a non-operating level (for example, a low level). For example, when the seventeenth voltage provided by the seventeenth voltage terminal VDD_17 is at an active level, the nineteenth transistor T19 is turned on, so that the third node N3 and the fifth node N5 are coupled, and the third node N3 can be pulled down to a non-operating level (for example, a low level). The sixteenth voltage (for example, a low level) provided by the sixteenth voltage terminal VDD_16 is input to the first node N1 through the turned-on eighteenth transistor T18, and the first node N1 is pulled down to an invalid level, that is, a low level.

For example, in at least one embodiment of the present disclosure, the nineteenth transistor T19 and the fourteenth transistor T14 may be the same transistor, and the seventeenth voltage terminal VDD_17 and the twelfth voltage terminal VDD_12 are the same voltage terminal, for example, to provide an active level, that is, a high level.

Figure 5B:
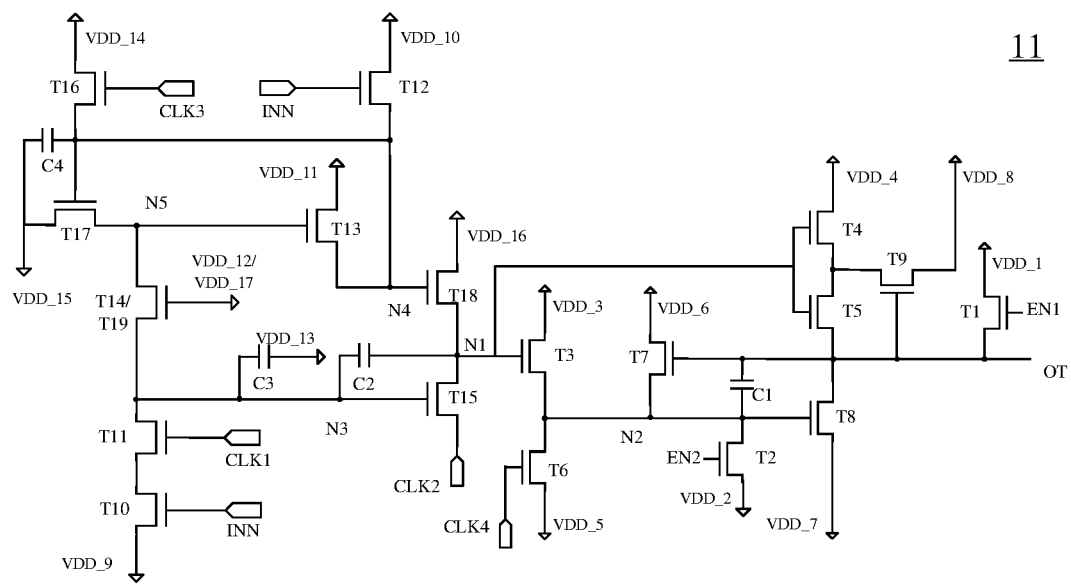
FIG. 5B is a circuit structure diagram of another shift register unit provided by at least one embodiment of the present disclosure.

FIG. 5B is a circuit structure schematic diagram of a shift register unit 11 provided by at least one embodiment of the present disclosure. It should be noted that, compared with the shift register unit 10 in FIG. 5A, the shift register unit 11 in FIG. 5B further includes a circuit structure of a second reset circuit 600, except the second reset circuit 600, the circuit structure of the shift register unit 11 in FIG. 5B is basically the same as the circuit structure of the shift register unit 10 in FIG. 5A.

For example, in at least one embodiment of the present disclosure, as shown in FIG. 5B, the second reset circuit 600 may include a second transistor T2. For example, a gate electrode of the second transistor T2 is coupled to the second enable signal terminal EN2 to receive the second enable signal, a first electrode of the second transistor T2 is coupled to the second node N2, and a second electrode of the second transistor T2 is coupled to the second voltage terminal VDD_2 to receive the second voltage.

For example, in an example, when the second enable signal EN2 is at an active level, the second transistor T2 is turned on, and the second voltage terminal VDD_2 is coupled to the second node N2. For example, when the second voltage provided by the second voltage terminal VDD_2 is at a non-operating level, that is, a low level, the second node N2 can be noise-reduced.

For example, in an example, the first enable signal EN1 and the second enable signal EN2 may be the same enable signal EN. For example, when the first enable signal EN1 and the second enable signal EN2 are active signals at the same time, the levels of the output terminal OT and the second node N2 can be controlled at the same time, so as to remove the output noise interference in time and ensure that the shift register unit 10 stably outputs a non-operating level (for example, a low level) during the detection phase.

Figure 6:
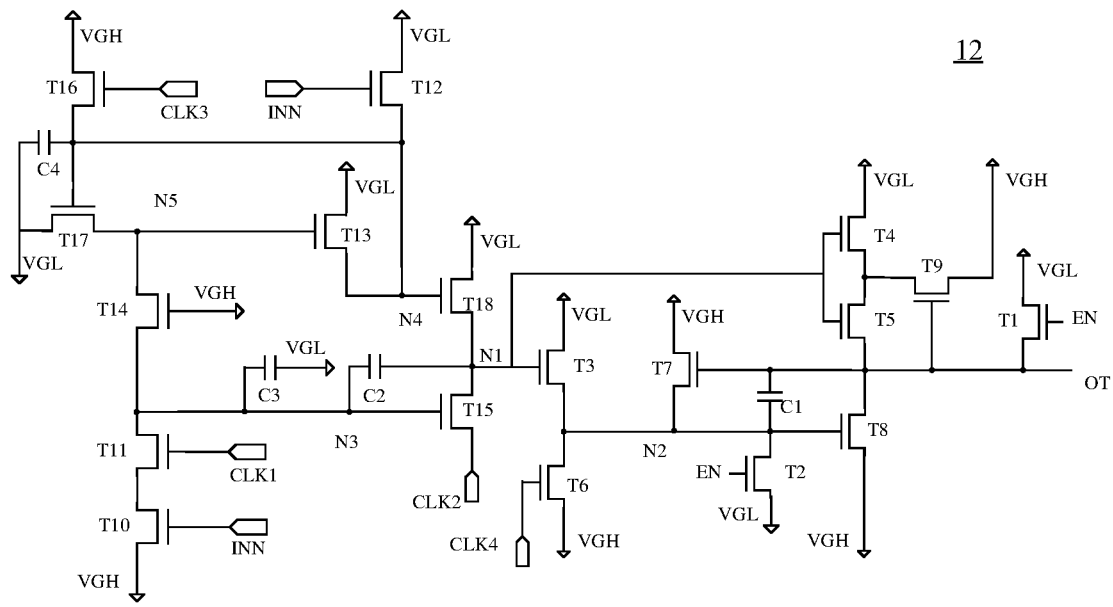
FIG. 6 is a circuit structure diagram of still another shift register unit provided by at least one embodiment of the present disclosure.

At least one embodiment of the present disclosure also provides a shift register unit 12. FIG. 6 is a circuit structure diagram of another shift register unit 12 provided by at least one embodiment of the present disclosure. As shown in FIG. 6, in an example, the shift register unit 12 includes: a first transistor T1 to an eighteenth transistor T18, and a first capacitor C1 to a fourth capacitor C4. For example, compared with the shift register unit 11 shown in FIG. 5B, in FIG. 6, all transistors are N-type transistors as an example, the fourteenth transistor T14 and the nineteenth transistor T19 are the same transistor, the first enable signal terminal EN1 and the second enable signal terminal EN2 are the same enable signal terminal EN, except that, the circuit structure of the shift register unit 12 in FIG. 6 is basically the same as the circuit structure of the shift register unit 11 in FIG. 5B.

It should be noted that in the example shown in FIG. 6, the first voltage terminal VDD_1, the second voltage terminal VDD_2, the third voltage terminal VDD_3, the fourth voltage terminal VDD_4, the tenth voltage terminal VDD_10, the eleventh voltage terminal VDD_11, the thirteenth voltage terminal VDD_13, the fifteenth voltage terminal VDD_15, and the sixteenth voltage terminal VDD_16 all provide voltages at a non-operating level, for example, a low-level voltage VGL. For example, in an example, these voltage terminals may all be coupled to a voltage terminal VGL, for example, the voltage terminal VGL may be configured to maintain inputting a DC low-level signal, such as ground. The fifth voltage terminal VDD_5, the sixth voltage terminal VDD_6, the seventh voltage terminal VDD_7, the eighth voltage terminal VDD_8, the ninth voltage terminal VDD_9, the twelfth voltage terminal VDD_12, and the fourteenth voltage terminal VDD_14 all provide voltages at an operating level, for example, a high-level voltage VGH. For example, in an example, these voltage terminals may all be coupled to a voltage terminal VGH, for example, the voltage terminal VGH may be configured to maintain inputting a DC high-level signal. Of course, in the embodiments of the present disclosure, each voltage terminal may be a separately provided voltage terminal, and the embodiments of the present disclosure are not limited thereto.

For example, in an example, as shown in FIG. 6, a gate electrode of the first transistor T1 is coupled to the first enable signal terminal EN1 to receive the first enable signal (that is, to be coupled to the enable signal terminal EN to receive the enable signal), a first electrode of the first transistor T1 is coupled to the first voltage terminal to receive a first voltage (for example, a low-level voltage VGL), and a second electrode of the first transistor T1 is coupled to the output terminal OT. A gate electrode of the second transistor T2 is coupled to the second enable signal terminal EN2 to receive the second enable signal (that is, to be coupled to the enable signal terminal EN to receive the enable signal), a first electrode of the second transistor T2 is coupled to the second node N2, and a second electrode of the second transistor T2 is coupled to the second voltage terminal to receive the second voltage (for example, a low-level voltage VGL). A gate electrode of the third transistor T3 is coupled to the first node N1, a first electrode of the third transistor T3 is coupled to the third voltage terminal to receive the third voltage (for example, a low-level voltage VGL), and a second electrode of the third transistor T3 is coupled to the second node N2. A gate electrode of the fourth transistor T4 is coupled to the first node N1, a first electrode of the fourth transistor T4 is coupled to the fourth voltage terminal to receive the fourth voltage (for example, a low-level voltage VGL), and a second electrode of the fourth transistor T4 is coupled to a first electrode of the fifth transistor T5. A gate electrode of the fifth transistor T5 is coupled to the first node N1, and a second electrode of the fifth transistor T5 is coupled to the output terminal OT. A gate electrode of the sixth transistor T6 is coupled to the fourth clock signal terminal CLK4 to receive the fourth clock signal, a first electrode of the sixth transistor T6 is coupled to the second node N2, and a second electrode of the sixth transistor T6 is coupled to the fifth voltage terminal to receive the fifth voltage (for example, a high-level voltage VGH). A gate electrode of the seventh transistor T7 is coupled to the output terminal OT, a first electrode of the seventh transistor T7 is coupled to the sixth voltage terminal to receive the sixth voltage (for example, a high-level voltage VGH), and a second electrode of the seventh transistor T7 is coupled to the second node N2. A gate electrode of the eighth transistor T8 is coupled to the second node N2, a first electrode of the eighth transistor T8 is coupled to the output terminal OT, and a second electrode of the eighth transistor T8 is coupled to the seventh voltage terminal to receive the seventh voltage (for example, a high-level voltage VGH). A gate electrode of the ninth transistor T9 is coupled to the output terminal OT, a first electrode of the ninth transistor T9 is coupled to the first electrode of the fifth transistor T5, and a second electrode of the ninth transistor T9 is coupled to the eighth voltage terminal to receive the eighth voltage (for example, a high-level voltage VGH). A first electrode of the first capacitor C1 is coupled to the output terminal OT, and a second electrode of the first capacitor C1 is coupled to the second node N2. A gate electrode of the tenth transistor T10 is coupled to the input terminal INN to receive an input signal, a first electrode of the tenth transistor T10 is coupled to a second electrode of the eleventh transistor T11, and a second electrode of the tenth transistor T10 is coupled to the ninth voltage terminal to receive the ninth voltage (for example, a high-level voltage VGH). A gate electrode of the eleventh transistor T11 is coupled to the first clock signal terminal CLK1 to receive the first clock signal, and a first electrode of the eleventh transistor T11 is coupled to the third node N3. A gate electrode of the twelfth transistor T12 is coupled to the input terminal INN to receive the input signal, a first electrode of the twelfth transistor T12 is coupled to the tenth voltage terminal to receive the tenth voltage (for example, a low-level voltage VGL), and a second electrode of the twelfth transistor T12 is coupled to the fourth node N4. A gate electrode of the thirteenth transistor T13 is coupled to a first electrode of the fourteenth transistor T14, a first electrode of the thirteenth transistor T13 is coupled to the eleventh voltage terminal to receive the eleventh voltage (for example, a low-level voltage VGL), and a second electrode of the thirteenth transistor T13 is coupled to the fourth node N4. A gate electrode of the fourteenth transistor T14 is coupled to the twelfth voltage terminal to receive the twelfth voltage (for example, a high-level voltage VGH), and a second electrode of the fourteenth transistor T14 is coupled to the third node N3. A gate electrode of the fifteenth transistor T15 is coupled to the third node N3, a first electrode of the fifteenth transistor T15 is coupled to the first node N1, and a second electrode of the fifteenth transistor T15 is coupled to the second clock signal terminal CLK2 to receive the second clock signal. A first electrode of the second capacitor C2 is coupled to the first node N1, and a second electrode of the second capacitor C2 is coupled to the third node N3. A first electrode of the third capacitor C3 is coupled to the third node N3, and a second electrode of the third capacitor C3 is coupled to the thirteenth voltage terminal to receive the thirteenth voltage (for example, a low-level voltage VGL). A gate electrode of the sixteenth transistor T16 is coupled to the third clock signal terminal CLK3 to receive the third clock signal, a first electrode of the sixteenth transistor T16 is coupled to the fourteenth voltage terminal to receive the fourteenth voltage (for example, a high-level voltage VGH), and a second electrode of the sixteenth transistor T16 is coupled to a gate electrode of the seventeenth transistor T17. A first electrode of the seventeenth transistor T17 is coupled to the fifteenth voltage terminal to receive the fifteenth voltage (for example, a low-level voltage VGL), and a second electrode of the seventeenth transistor T17 is coupled to the gate electrode of the thirteenth transistor T13. A gate electrode of the eighteenth transistor T18 is coupled to the fourth node N4, a first electrode of the eighteenth transistor T18 is coupled to the sixteenth voltage terminal to receive the sixteenth voltage (for example, a low-level voltage VGL), and a second electrode of the eighteenth transistor T18 is coupled to the first node N1. A first electrode of the fourth capacitor C4 is coupled to the gate electrode of the seventeenth transistor T17, and a second electrode of the fourth capacitor C4 is coupled to the first electrode of the seventeenth transistor T17.

Figure 7:
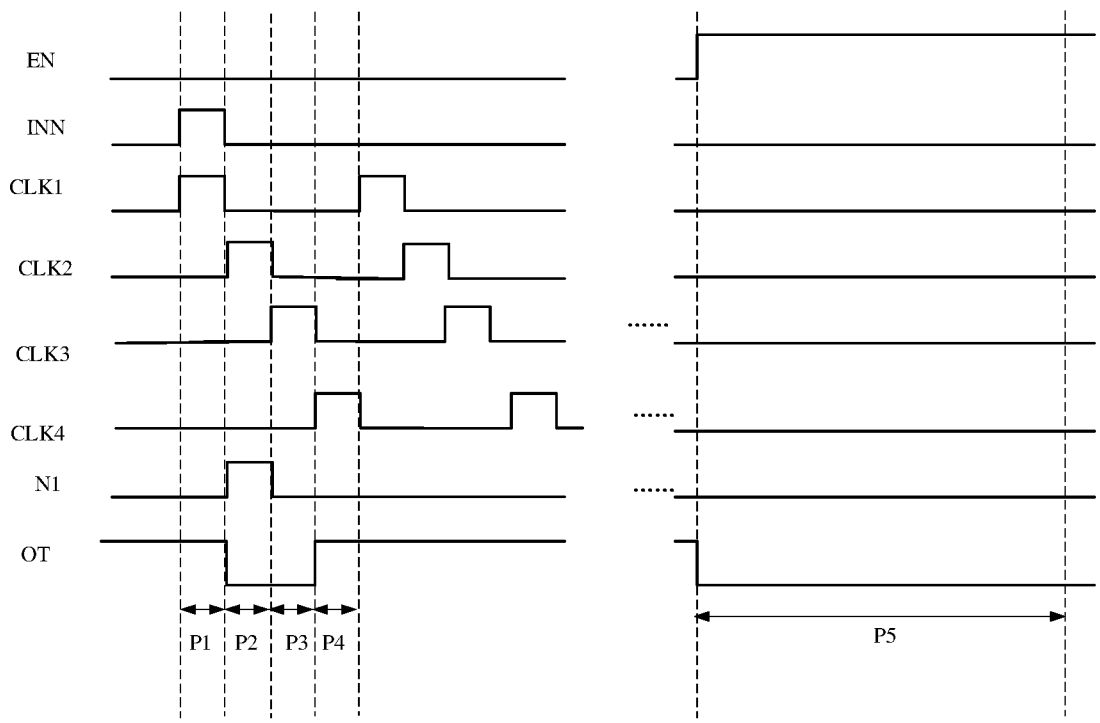
FIG. 7 is a signal timing diagram of a shift register unit provided by at least one embodiment of the present disclosure.

FIG. 7 is a signal timing diagram of a shift register unit provided by at least one embodiment of the present disclosure. The working principle of the shift register unit 12 shown in FIG. 6 will be described below in conjunction with the signal timing diagram shown in FIG. 7. It should be noted that the level of the potential in the signal timing diagram shown in FIG. 7 is only illustrative, and does not represent the true potential value. It should also be noted that the working principles of the shift register units 10 and 11 in FIGS. 5A and 5B are basically the same as the working principle of the shift register unit 12 in FIG. 6, for the sake of brevity, the similar portions will not repeated again in the embodiments of the present disclosure.

As shown in FIG. 7, the signal timing diagram includes a first phase P1, a second phase P2, a third phase P3, a fourth phase P4, and a fifth phase P5. For example, in the embodiments of the present disclosure, the driving phase includes the first phase P1, the second phase P2, the third phase P3, and the fourth phase P4, and the detection phase (also referred to as a non-operating level maintaining phase) includes the fifth phase P5. For example, during the first phase P1 to the fourth phase P4 (that is, during the driving phase), the enable signal EN is at an invalid level (for example, a low level), the shift register unit is in a normal working state, that is, a normal driving phase, and in the fifth phase P5, that is, the detection phase (for example, a low-level maintaining phase), the enable signal EN is at an active level (for example, a high level).

For example, in the first phase P1, the input signal provided by the input terminal INN and the first clock signal provided by the first clock signal terminal CLK1 are at an active level (for example, a high level) at the same time, the second clock signal CLK2, the third clock signal CLK3, and the fourth clock signal CLK4 are at an invalid level (for example, a low level), the tenth transistor T10 and the eleventh transistor T11 are turned on, and the ninth voltage (for example, a high level) provided by the ninth voltage terminal VDD_9 is input to the third node N3 to pull up the level of the third node N3 to an operating level (for example, a high level). At this time, the fifteenth transistor T15 is turned on, and the second clock signal (in the first phase P1, CLK2 is a low level) provided by the second clock signal terminal CLK2 can be provided to the first node N1, and then the first node N1 is at a non-operating level (i.e., a low level). At this time, the third transistor T3, the fourth transistor T4, and the fifth transistor T5 are all turned off, and the output terminal OT is at an active level, that is, a high level.

In the second phase P2, the second clock signal provided by the second clock signal terminal CLK2 changes from a low level to a high level, the input signal provided by the input terminal INN and the first clock signal provided by the first clock signal terminal CLK1 change from a high level to a low level, the third clock signal CLK3 and the fourth clock signal CLK4 are at a low level. At this time, the fifteenth transistor T15 inputs the high level of the second clock signal CLK2 to the first node N1, due to the bootstrap effect of the first capacitor C1, the fifteenth transistor T15 is more fully turned on to input the high level of the second clock signal CLK2 to the first node N1, so as to pull up the level of the first node N1 to the operating level, that is, a high level. At this time, the third transistor T3, the fourth transistor T4, and the fifth transistor T5 are all turned on, and the output terminal OT is pulled down to a low level.

In the third phase P3, the third clock signal CLK3 changes from a low level to a high level, and the input signal INN, the first clock signal CLK1, the second clock signal CLK2, and the fourth clock signal CLK4 are at a low level. The sixteenth transistor T16 is turned on, the fourteenth voltage (for example, a high level) provided by the fourteenth voltage terminal VDD_14 is input to the fourth node N4, and the fourth node N4 is pulled up to the operating level (for example, a high level). At this time, the eighteenth transistor T18 is turned on, the sixteenth voltage (for example, a low level) provided by the sixteenth voltage terminal VDD_16 is input to the first node N1, and the first node N1 is pulled down to a low level. At this time, the third transistor T3, the fourth transistor T4, and the fifth transistor T5 are all turned off, and the output terminal OT is maintained at a low level.

In the fourth phase P4, the fourth clock signal provided by the fourth clock signal terminal CLK4 changes from a low level to a high level, and the input signal provided by the input terminal INN, the first clock signal CLK1, the second clock signal CLK2, and the third clock signal CLK3 are all at a low level. At this time, the first node N1 is maintained at a low level, the sixth transistor T6 is turned on, the fifth voltage (for example, a high level) provided by the fifth voltage terminal VDD_5 can be input to the second node N2 through the sixth transistor T6, so as to pull up the level of the second node N2 to the operating level (for example, a high level). At this time, the eighth transistor T8 is turned on, the seventh voltage (for example, a high level) provided by the seventh voltage terminal VDD_7 is input to the output terminal OT through the eighth transistor T8, so as to pull up the level of the output terminal OT to the operating level (for example, a high level). In addition, due to the bootstrap effect of the first capacitor C1, the level of the output terminal OT can be maintained at the high level VGH.

In the above-mentioned first phase P1 to fourth phase P4, that is, the driving phase, the shift register unit 12 can work normally, achieve a normal driving function, and meet the requirements of the driving phase of the display panel.

In the fifth phase P5, the input signal INN, the first clock signal CLK1, the second clock signal CLK2, the third clock signal CLK3, and the fourth clock signal CLK4 are all at an invalid level, that is, at a low level, and the enable signal EN is at an active level, that is, a high level. At this time, the first transistor T1 and the second transistor T2 are turned on, the first voltage (for example, a low level) provided by the first voltage terminal VDD_1 can be input to the output terminal OT through the first transistor T1 to perform noise reduction on the output terminal OT, so as to ensure that the output terminal OT outputs a low level stably. The second voltage (for example, a low level) provided by the second voltage terminal VDD_2 can be input to the second node N2 through the second transistor T2 to ensure that the second node N2 is at a non-operating level and the eighth transistor T8 is turned off, thereby preventing leakage of the eighth transistor T8.

For example, if the first transistor T1 is not provided, in the fifth phase P5, the first node N1 is maintained at a low level, the fourth transistor T4 and the fifth transistor T5 are turned off, and the output terminal OT is in a floating state and cannot output a low level stably. For example, if the second transistor T2 is not provided, the sixth transistor T6 may leak, so that the potential of the second node N2 gradually rises, which in turn causes the leakage of the eighth transistor T8 to increase, and finally causes the potential of the output terminal OT to gradually rise, and the output terminal OT also cannot output a low level stably.

In the above-mentioned fifth phase P5, that is, the detection phase, the shift register unit 12 can stably output a non-operating level (for example, a low level) for a long time.

Therefore, the shift register unit 10/11/12 provided by the embodiments of the present disclosure can ensure that the output noise interference is removed in time under low frequency driving, so as to ensure that the GOA stably outputs a non-operating level (for example, a low level) during the detection phase. Therefore, the shift register unit 10/11/12 can not only achieve the normal driving function in the driving phase, but also ensure the stable output of the non-operating level for a long time in the detection phase.

At least one embodiment of the present disclosure further provides a gate driving circuit, and the gate driving circuit includes a plurality of cascaded shift register units provided by any embodiment of the present disclosure. The gate driving circuit can ensure that the output noise interference is removed in time under low frequency driving, so as to ensure to stably output the non-operating level (for example, a low level) during the detection phase. Therefore, the normal driving function can be achieved in the driving phase, and stably outputting the non-operating level for a long time can also be ensured in the detection phase.

Figure 8:
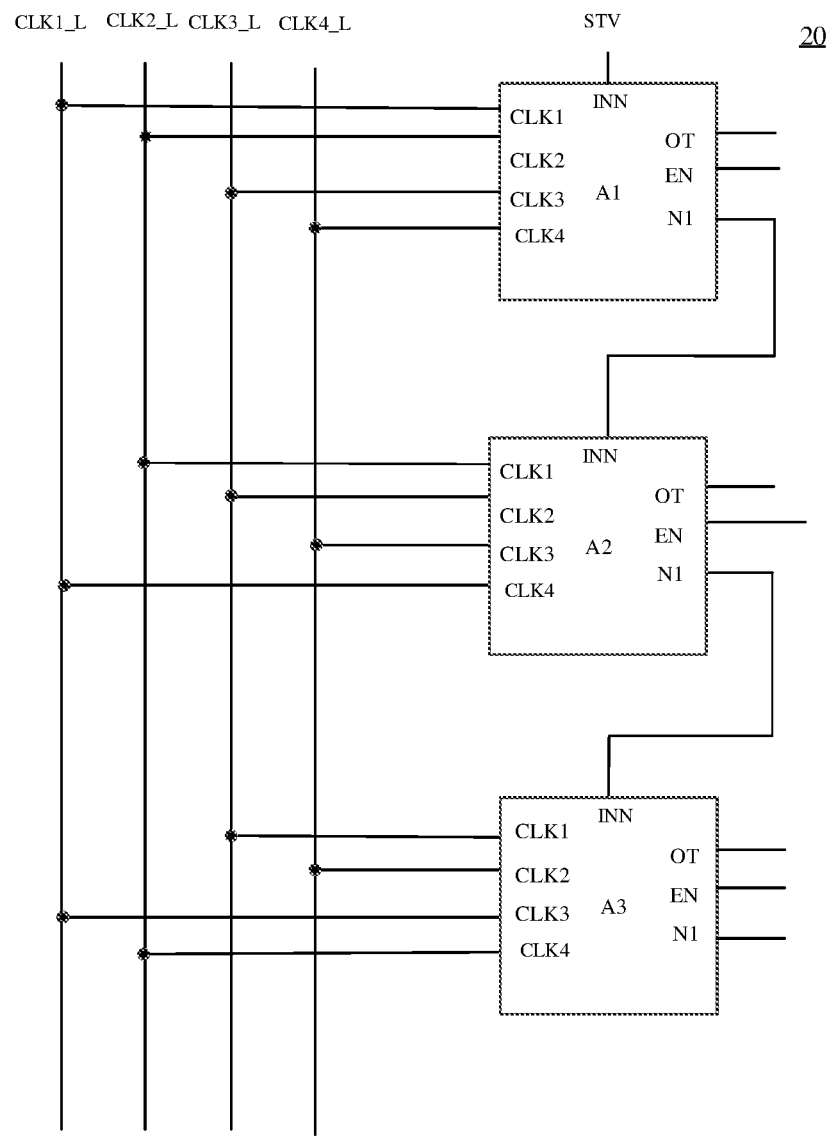
FIG. 8 is a schematic block diagram of a gate driving circuit provided by at least one embodiment of the present disclosure.

FIG. 8 is a schematic block diagram of a gate driving circuit provided by at least one embodiment of the present disclosure. As shown in FIG. 8, the gate driving circuit 20 includes a plurality of cascaded shift register units (for example, A1, A2, A3, etc.). The amount of the plurality of shift register units is not limited and can be determined according to actual needs. For example, the shift register unit adopts the shift register unit 10/11/12 described in any embodiment of the present disclosure. For example, in the gate driving circuit 20, part or all of the shift register units may be the shift register unit 10/11/12 described in any embodiment of the present disclosure. For example, the gate driving circuit 20 can be directly integrated on an array substrate of a display device using the same manufacturing process as the thin film transistor to form a GOA, and can achieve, for example, a progressive scan driving function.

For example, in some examples, as shown in FIG. 8, each shift register unit may have a first node N1, an input terminal INN, a first clock signal terminal CLK1, a second clock signal terminal CLK2, a third clock signal terminal CLK3, a fourth clock signal terminal CLK4, a signal enable terminal EN, and an output terminal OT.

For example, in the gate driving circuit 20 provided by an embodiment of the present disclosure, the input terminal INN of a shift register unit of an N-th stage is coupled to the first node N1 of a shift register unit of a (N−1)-th stage; the first node N1 of the shift register unit of the N-th stage is coupled to the input terminal INN of a shift register unit of a (N+1)-th stage; N is an integer greater than 2.

For example, in some examples, as shown in FIG. 8, except for a shift register unit of the last stage (for example, the third shift register unit A3), the first node N1 of the shift register unit of each stage is coupled to the input terminal INN of a shift register unit of the next stage. Except for a shift register unit of the first stage (for example, the first shift register unit A1), the input terminal INN of the shift register unit of each stage is coupled to the first node N1 of the shift register unit of the previous stage. For example, the input terminal INN of the shift register unit of the first stage may be configured to receive a trigger signal STV, and the embodiments of the present disclosure do not specifically limit this.

As shown in FIG. 8, the gate driving circuit 20 may further include a first clock signal line CLK1_L, a second clock signal line CLK2_L, a third clock signal line CLK3_L, and a fourth clock signal line CLK4_L. For example, as shown in FIG. 8, the coupling manner of the shift register units of the respective stages and the above-mentioned clock signal lines are as follows and so on. For example, the first clock signal terminal CLK1 of the shift register unit A1 of the first stage, the fourth clock signal terminal CLK4 of the shift register unit A2 of the second stage, and the third clock signal terminal CLK3 of the shift register unit A3 of the third stage are coupled to the first clock signal line CLK1_L; the second clock signal terminal CLK2 of the shift register unit A1 of the first stage, the first clock signal terminal CLK1 of the shift register unit A2 of the second stage, and the fourth clock signal terminal CLK4 of the shift register unit A3 of the third stage are coupled to the second clock signal line CLK2_L; the third clock signal terminal CLK3 of the shift register unit A1 of the first stage, the second clock signal terminal CLK2 of the shift register unit A2 of the second stage, and the first clock signal terminal CLK1 of the shift register unit A3 of the third stage are coupled to the third clock signal line CLK3_L; the fourth clock signal terminal CLK4 of the shift register unit A1 of the first stage, the third clock signal terminal CLK3 of the shift register unit A2 of the second stage, and the second clock signal terminal CLK2 of the shift register unit A3 of the third stage are coupled to the fourth clock signal line CLK4_L, and so on. It should be noted that the embodiments of the present disclosure include, but are not limited to, the foregoing coupling manner. For example, in other examples, the first clock signal terminal CLK1, the second clock signal terminal CLK2, the third clock signal terminal CLK3, and the fourth clock signal terminal CLK4 of each shift register unit in the gate driving circuit 20 can be coupled to a plurality of separately provided clock signal lines, the plurality of clock signal lines are, for example, more than 4 clock signal lines, and not all the first clock signal terminals CLK1 are coupled to the same clock signal line, not all the second clock signal terminals CLK2 are coupled to the same clock signal line, not all the third clock signal terminals CLK3 are coupled to the same clock signal line, and not all the fourth clock signal terminals CLK4 are coupled to the same clock signal line.

This may be determined according to actual requirements, and the embodiments of the present disclosure do not limit this.

For example, the timing of the clock signals respectively provided on the first clock signal line CLK1_L, the second clock signal line CLK2_L, the third clock signal line CLK3_L, and the fourth clock signal line CLK4_L can adopt the signal timing shown in FIG. 7 to achieve the function that the gate driving circuit 20 can stably output at a non-operating level for a long time in the detection phase.

For example, the display device to which the gate driving circuit 20 is applied may further include a timing controller T-CON. For example, the timing controller T-CON is configured to be coupled to the first clock signal line CLK1_L, the second clock signal line CLK2_L, the third clock signal line CLK3_L, and the fourth clock signal line CLK4_L, so as to provide various clock signals to the shift register units of respective stages. The timing controller T-CON can also be configured to provide the trigger signal STY. It should be noted that the phase relationship between the plurality of clock signals provided by the timing controller T-CON may be determined according to actual requirements. In different examples, more clock signals can be provided according to different configurations.

For example, in some examples, when the gate driving circuit 20 is used to drive the display panel, the gate driving circuit 20 may be disposed on one side of the display panel. For example, the gate driving circuit 20 can be directly integrated on the array substrate of the display panel using the same manufacturing process as the thin film transistor to form a GOA, thereby achieving the driving function. Of course, the gate driving circuits 20 can also be arranged on both sides of the display panel to achieve bilateral driving. The embodiments of the present disclosure do not limit the arrangement mode of the gate driving circuit 20. For the working principle of the gate driving circuit 20, reference may be made to the corresponding description of the working principle of the shift register unit 10/11/12 in the embodiments of the present disclosure, which will not be repeated here.

At least one embodiment of the present disclosure also provides a display device. The display device includes the shift register unit according to any embodiment of the present disclosure or the gate driving circuit according to any embodiment of the present disclosure.

FIG. 9 is a schematic block diagram of a display device provided by at least one embodiment of the present disclosure. For example, as shown in FIG. 9, the display device 30 includes a gate driving circuit 20, and the gate driving circuit 20 may be the gate driving circuit 20 provided in any embodiments of the present disclosure. For example, the display device 30 in this embodiment may be a liquid crystal display panel, a liquid crystal TV, an OLED display panel, an OLED TV, an OLED display, a quantum dot light emitting diode (QLED) display panel, etc., and can also be any product or component with a display function, such as an e-book, a mobile phone, a tablet computer, a notebook computer, a digital photo frame, a navigator, etc., and the embodiments of the present disclosure do not limit this. For the technical effects of the display device 30, reference may be made to the corresponding descriptions of the shift register unit 10/11/12 and the gate driving circuit 20 in the above-mentioned embodiments, which will not be repeated here.

For example, in some examples, the display device 30 includes a display panel 3000, a gate driver 3010, and a data driver 3030. The display panel 3000 includes a plurality of pixel units P defined according to the intersection of a plurality of scan lines GL and a plurality of data lines DL; the gate driver 3010 is used to drive the plurality of scan lines GL, and the gate driver 3010 may be the gate driving circuit 20 provided in any embodiments of the present disclosure; the data driver 3030 is used to drive the plurality of data lines DL. The data driver 3030 is electrically coupled to the pixel unit P through the data line DL, and the gate driver 3010 is electrically coupled to the pixel unit P through the scan line GL.

For example, the gate driver 3010 and the data driver 3030 may be implemented as semiconductor chips. For example, the gate driver 3010 (the gate driving circuit 20) may also be implemented as a GOA circuit. The display device 30 may also include other components, such as a timing controller, a signal decoding circuit, a voltage conversion circuit, etc. These components may, for example, adopt existing conventional components, which will not be described in detail here.

FIG. 10 is a flowchart of a method 1000 for driving a shift register unit provided by at least one embodiment of the present disclosure. For example, as shown in FIG. 10, the method 1000 for driving the shift register unit may include:

step S1001: in a driving phase, under control of the input signal INN, the first clock signal CLK1, the second clock signal CLK2, the third clock signal CLK3, the fourth clock signal CLK4, and the enable signal EN, controlling the level of the output terminal OT to output a driving signal in the driving phase; and step S1002: in the detection phase, the input control circuit 100 controlling the level of the first node N1 to be the non-operating level under control of the input signal INN, the first clock signal CLK1, the second clock signal CLK2, and the third clock signal CLK3; the first control circuit 200 controlling the level of the second node N2 under control of the level of the first node N1; the second control circuit 300 controlling the level of the second node N2 under control of the fourth clock signal CLK4 and the output signal OT; the output circuit 500 controlling the level of the output terminal OT under control of the level of the first node N1 and the level of the second node N2; and the first reset circuit 400 controlling the level of the output terminal OT under control of the first enable signal EN1, so as to allow the output terminal OT to stably output the non-operating level (for example, a low level) during the detection phase.

For the detailed description and technical effects of the method provided by the embodiments of the present disclosure, reference may be made to the corresponding description of the shift register unit 10/11/12 and the corresponding description of the gate driving circuit 20 in the embodiments of the present disclosure, and similar portions will not be repeated here.

For the present disclosure, the following is to be noted.

(1) The drawings of the embodiments of the present disclosure only relate to the structures relevant to the embodiments of the present disclosure, and other structures may be referred to the general design.

(2) In case of no conflict, the embodiments of the present disclosure and the features in the embodiments can be combined with each other to obtain new embodiments.

What have been described above merely are exemplary embodiments of the present disclosure, and not intended to define the scope of the present disclosure, and the scope of the present disclosure is determined by the appended claims.

What is claimed is:

1. A shift register unit, comprising: an input control circuit, a first control circuit, a second control circuit, an output circuit, and a first reset circuit,
wherein the input control circuit is coupled to a first node, an input terminal, a first clock signal terminal, a second clock signal terminal, and a third clock signal terminal, and is configured to control a level of the first node under control of an input signal of the input terminal, a first clock signal of the first clock signal terminal, a second clock signal of the second clock signal terminal, and a third clock signal of the third clock signal terminal;
the first control circuit is coupled to the first node and a second node, and is configured to control a level of the second node under control of the level of the first node;
the second control circuit is coupled to a fourth clock signal terminal, the second node, and an output terminal, and is configured to control the level of the second node under control of a fourth clock signal of the fourth clock signal terminal and an output signal of the output terminal;
the output circuit is coupled to the first node, the second node, and the output terminal, and is configured to control a level of the output terminal under control of the level of the first node and the level of the second node; and
the first reset circuit is coupled to the output terminal and a first enable signal terminal, a first enable signal is provided to the first enable signal terminal by a first enable signal line, and the first reset circuit is configured to control the level of the output terminal under control of the first enable signal, so as to allow the output terminal to stably output a non-operating level during a detection phase.

2. The shift register unit according to claim 1, further comprising: a second reset circuit,
wherein the second reset circuit is coupled to the second node and a second enable signal terminal, a second enable signal is provided to the second enable signal terminal by a second enable signal line, and the second reset circuit is configured to control the level of the second node under control of the second enable signal.

3. The shift register unit according to claim 2, wherein the first enable signal and the second enable signal are a same enable signal.

4. The shift register unit according to claim 2, wherein the second reset circuit comprises a second transistor,
a gate electrode of the second transistor is coupled to the second enable signal terminal to receive the second enable signal, a first electrode of the second transistor is coupled to the second node, and a second electrode of the second transistor is coupled to a second voltage terminal to receive a second voltage.

5. The shift register unit according to claim 1, wherein the first reset circuit comprises a first transistor,
a gate electrode of the first transistor is coupled to the first enable signal terminal to receive the first enable signal, a first electrode of the first transistor is coupled to a first voltage terminal to receive a first voltage, and a second electrode of the first transistor is coupled to the output terminal.

6. The shift register unit according to claim 1, wherein the input control circuit comprises an input circuit,
the input circuit is coupled to the first clock signal terminal, the input terminal, a third node, and a fourth node, and is configured to control a level of the third node and a level of the fourth node in response to the input signal of the input terminal and the first clock signal of the first clock signal terminal.

7. The shift register unit according to claim 6, wherein the input control circuit comprises a third control circuit,
the third control circuit is coupled to the second clock signal terminal, the first node, and the third node, and is configured to provide the second clock signal of the second clock signal terminal to the first node under control of the level of the third node.

8. The shift register unit according to claim 7, wherein the input control circuit comprises a third reset circuit,
the third reset circuit is coupled to the third clock signal terminal, the first node, and the third node, and is configured to control the level of the third node and the level of the first node in response to the third clock signal of the third clock signal terminal.

9. The shift register unit according to claim 8, wherein the input circuit comprises a tenth transistor, an eleventh transistor, a twelfth transistor, a thirteenth transistor, and a fourteenth transistor,
a gate electrode of the tenth transistor is coupled to the input terminal to receive the input signal, a first electrode of the tenth transistor is coupled to a second electrode of the eleventh transistor, and a second electrode of the tenth transistor is coupled to a ninth voltage terminal to receive a ninth voltage;
a gate electrode of the eleventh transistor is coupled to the first clock signal terminal to receive the first clock signal, and a first electrode of the eleventh transistor is coupled to the third node;
a gate electrode of the twelfth transistor is coupled to the input terminal to receive the input signal, a first electrode of the twelfth transistor is coupled to a tenth voltage terminal to receive a tenth voltage, and a second electrode of the twelfth transistor is coupled to the fourth node;
a gate electrode of the thirteenth transistor is coupled to a first electrode of the fourteenth transistor, a first electrode of the thirteenth transistor is coupled to an eleventh voltage terminal to receive an eleventh voltage, and a second electrode of the thirteenth transistor is coupled to the fourth node; and
a gate electrode of the fourteenth transistor is coupled to a twelfth voltage terminal to receive a twelfth voltage, and a second electrode of the fourteenth transistor is coupled to the third node.

10. The shift register unit according to claim 9, wherein the third reset circuit comprises a sixteenth transistor, a seventeenth transistor, an eighteenth transistor, a nineteenth transistor, and a fourth capacitor,
wherein a gate electrode of the sixteenth transistor is coupled to the third clock signal terminal to receive the third clock signal, a first electrode of the sixteenth transistor is coupled to a fourteenth voltage terminal to receive a fourteenth voltage, and a second electrode of the sixteenth transistor is coupled to a gate electrode of the seventeenth transistor;
a first electrode of the seventeenth transistor is coupled to a fifteenth voltage terminal to receive a fifteenth voltage, and a second electrode of the seventeenth transistor is coupled to a first electrode of the nineteenth transistor;
a gate electrode of the eighteenth transistor is coupled to the fourth node, a first electrode of the eighteenth transistor is coupled to a sixteenth voltage terminal to receive a sixteenth voltage, and a second electrode of the eighteenth transistor is coupled to the first node;

a gate electrode of the nineteenth transistor is coupled to a seventeenth voltage terminal to receive a seventeenth voltage, and a second electrode of the nineteenth transistor is coupled to the third node; and a first electrode of the fourth capacitor is coupled to the gate electrode of the seventeenth transistor, and a second electrode of the fourth capacitor is coupled to the first electrode of the seventeenth transistor.

11. The shift register unit according to claim 10, wherein the nineteenth transistor and the fourteenth transistor are a same transistor.

12. The shift register unit according to claim 7, wherein the third control circuit comprises a fifteenth transistor, a second capacitor, and a third capacitor, wherein a gate electrode of the fifteenth transistor is coupled to the third node, a first electrode of the fifteenth transistor is coupled to the first node, and a second electrode of the fifteenth transistor is coupled to the second clock signal terminal to receive the second clock signal;

a first electrode of the second capacitor is coupled to the first node, and a second electrode of the second capacitor is coupled to the third node; and a first electrode of the third capacitor is coupled to the third node, and a second electrode of the third capacitor is coupled to a thirteenth voltage terminal to receive a thirteenth voltage.

13. The shift register unit according to claim 1, wherein the first control circuit comprises a third transistor, a gate electrode of the third transistor is coupled to the first node, a first electrode of the third transistor is coupled to a third voltage terminal to receive a third voltage, and a second electrode of the third transistor is coupled to the second node.

14. The shift register unit according to claim 1, wherein the second control circuit comprises a sixth transistor, a seventh transistor, and a first capacitor, a gate electrode of the sixth transistor is coupled to the fourth clock signal terminal to receive the fourth clock signal, a first electrode of the sixth transistor is coupled to the second node, and a second electrode of the sixth transistor is coupled to a fifth voltage terminal to receive a fifth voltage;

a gate electrode of the seventh transistor is coupled to the output terminal, a first electrode of the seventh transistor is coupled to a sixth voltage terminal to receive a sixth voltage, and a second electrode of the seventh transistor is coupled to the second node; and a first electrode of the first capacitor is coupled to the output terminal, and a second electrode of the first capacitor is coupled to the second node.

15. The shift register unit according to claim 1, wherein the output circuit comprises a fourth transistor, a fifth transistor, an eighth transistor, and a ninth transistor, a gate electrode of the fourth transistor is coupled to the first node, a first electrode of the fourth transistor is coupled to a fourth voltage terminal to receive a fourth voltage, and a second electrode of the fourth transistor is coupled to a first electrode of the fifth transistor;

a gate electrode of the fifth transistor is coupled to the first node, and a second electrode of the fifth transistor is coupled to the output terminal;

a gate electrode of the eighth transistor is coupled to the second node, a first electrode of the eighth transistor is coupled to the output terminal, and a second electrode of the eighth transistor is coupled to a seventh voltage terminal to receive a seventh voltage; and a gate electrode of the ninth transistor is coupled to the output terminal, a first electrode of the ninth transistor is coupled to the first electrode of the fifth transistor, and a second electrode of the ninth transistor is coupled to an eighth voltage terminal to receive an eighth voltage.

16. A gate driving circuit, comprising a plurality of shift register units, which are cascaded, according to claim 1.

17. The gate driving circuit according to claim 16, wherein an input terminal of a shift register unit of an N-th stage is coupled to a first node of a shift register unit of a (N−1)-th stage; and N is an integer greater than 2.

18. A display device, comprising the shift register unit according to claim 1.

19. A method for driving the shift register unit according to claim 1, comprising:

in a driving phase, under control of the input signal, the first clock signal, the second clock signal, the third clock signal, the fourth clock signal, and the first enable signal, controlling the level of the output terminal to output a driving signal in the driving phase; and in the detection phase, the input control circuit controlling the level of the first node to be the non-operating level under control of the input signal, the first clock signal, the second clock signal, and the third clock signal; the first control circuit controlling the level of the second node under control of the level of the first node; the second control circuit controlling the level of the second node under control of the fourth clock signal and the output signal; the output circuit controlling the level of the output terminal under control of the level of the first node and the level of the second node; and the first reset circuit controlling the level of the output terminal under control of the first enable signal, so as to allow the output terminal to stably output the non-operating level during the detection phase.

20. A shift register unit, comprising: a first transistor to an eighteenth transistor, and a first capacitor to a fourth capacitor, wherein a gate electrode of the first transistor is coupled to a first enable signal terminal to receive a first enable signal, a first electrode of the first transistor is coupled to a first voltage terminal to receive a first voltage, and a second electrode of the first transistor is coupled to an output terminal;

a gate electrode of a second transistor is coupled to a second enable signal terminal to receive a second enable signal, a first electrode of the second transistor is coupled to a second node, and a second electrode of the second transistor is coupled to a second voltage terminal to receive a second voltage;

a gate electrode of a third transistor is coupled to a first node, a first electrode of the third transistor is coupled to a third voltage terminal to receive a third voltage, and a second electrode of the third transistor is coupled to the second node;

a gate electrode of a fourth transistor is coupled to the first node, a first electrode of the fourth transistor is coupled to a fourth voltage terminal to receive a fourth voltage, and a second electrode of the fourth transistor is coupled to a first electrode of a fifth transistor;

a gate electrode of the fifth transistor is coupled to the first node, and a second electrode of the fifth transistor is coupled to the output terminal;

a gate electrode of a sixth transistor is coupled to a fourth clock signal terminal to receive a fourth clock signal, a first electrode of the sixth transistor is coupled to the second node, and a second electrode of the sixth transistor is coupled to a fifth voltage terminal to receive a fifth voltage;

a gate electrode of a seventh transistor is coupled to the output terminal, a first electrode of the seventh transistor is coupled to a sixth voltage terminal to receive a sixth voltage, and a second electrode of the seventh transistor is coupled to the second node;

a gate electrode of an eighth transistor is coupled to the second node, a first electrode of the eighth transistor is coupled to the output terminal, and a second electrode of the eighth transistor is coupled to a seventh voltage terminal to receive a seventh voltage;

a gate electrode of a ninth transistor is coupled to the output terminal, a first electrode of the ninth transistor is coupled to the first electrode of the fifth transistor, and a second electrode of the ninth transistor is coupled to an eighth voltage terminal to receive an eighth voltage;

a first electrode of the first capacitor is coupled to the output terminal, and a second electrode of the first capacitor is coupled to the second node;

a gate electrode of a tenth transistor is coupled to an input terminal to receive an input signal, a first electrode of the tenth transistor is coupled to a second electrode of an eleventh transistor, and a second electrode of the tenth transistor is coupled to a ninth voltage terminal to receive a ninth voltage;

a gate electrode of the eleventh transistor is coupled to a first clock signal terminal to receive a first clock signal, and a first electrode of the eleventh transistor is coupled to a third node;

a gate electrode of a twelfth transistor is coupled to the input terminal to receive the input signal, a first electrode of the twelfth transistor is coupled to a tenth voltage terminal to receive a tenth voltage, and a second electrode of the twelfth transistor is coupled to a fourth node;

a gate electrode of a thirteenth transistor is coupled to a first electrode of a fourteenth transistor, a first electrode of the thirteenth transistor is coupled to an eleventh voltage terminal to receive an eleventh voltage, and a second electrode of the thirteenth transistor is coupled to the fourth node;

a gate electrode of the fourteenth transistor is coupled to a twelfth voltage terminal to receive a twelfth voltage, and a second electrode of the fourteenth transistor is coupled to the third node;

a gate electrode of a fifteenth transistor is coupled to the third node, a first electrode of the fifteenth transistor is coupled to the first node, and a second electrode of the fifteenth transistor is coupled to a second clock signal terminal to receive a second clock signal;

a first electrode of a second capacitor is coupled to the first node, and a second electrode of the second capacitor is coupled to the third node;

a first electrode of a third capacitor is coupled to the third node, and a second electrode of the third capacitor is coupled to a thirteenth voltage terminal to receive a thirteenth voltage;

a gate electrode of a sixteenth transistor is coupled to a third clock signal terminal to receive a third clock signal, a first electrode of the sixteenth transistor is coupled to a fourteenth voltage terminal to receive a fourteenth voltage, and a second electrode of the sixteenth transistor is coupled to a gate electrode of a seventeenth transistor;

a first electrode of the seventeenth transistor is coupled to a fifteenth voltage terminal to receive a fifteenth voltage, and a second electrode of the seventeenth transistor is coupled to the gate electrode of the thirteenth transistor;

a gate electrode of the eighteenth transistor is coupled to the fourth node, a first electrode of the eighteenth transistor is coupled to a sixteenth voltage terminal to receive a sixteenth voltage, and a second electrode of the eighteenth transistor is coupled to the first node; and a first electrode of the fourth capacitor is coupled to the gate electrode of the seventeenth transistor, and a second electrode of the fourth capacitor is coupled to the first electrode of the seventeenth transistor.

* * * * *